(12) United States Patent
Yamazaki et al.

(10) Patent No.: US 11,774,816 B2
(45) Date of Patent: Oct. 3, 2023

(54) DISPLAY DEVICE, DISPLAY MODULE, AND ELECTRONIC DEVICE

(71) Applicant: Semiconductor Energy Laboratory Co., Ltd., Atsugi (JP)

(72) Inventors: Shunpei Yamazaki, Setagaya (JP); Koji Kusunoki, Isehara (JP); Susumu Kawashima, Atsugi (JP); Daisuke Kubota, Atsugi (JP); Tetsuji Ishitani, Atsugi (JP); Akio Yamashita, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 131 days.

(21) Appl. No.: 17/288,690

(22) PCT Filed: Oct. 22, 2019

(86) PCT No.: PCT/IB2019/058965
§ 371 (c)(1),
(2) Date: Apr. 26, 2021

(87) PCT Pub. No.: WO2020/089728
PCT Pub. Date: May 7, 2020

(65) Prior Publication Data
US 2021/0356797 A1 Nov. 18, 2021

(30) Foreign Application Priority Data
Nov. 2, 2018 (JP) .................. 2018-207225

(51) Int. Cl.
*G02F 1/1362* (2006.01)
*G02F 1/1333* (2006.01)
(Continued)

(52) U.S. Cl.
CPC ...... *G02F 1/13624* (2013.01); *C09K 19/3857* (2013.01); *G02F 1/1368* (2013.01);
(Continued)

(58) Field of Classification Search
CPC ........... G02F 1/13624; G02F 1/133357; G02F 1/13756
See application file for complete search history.

(56) References Cited

U.S. PATENT DOCUMENTS 6,714,268 B2 3/2004 Wang et al.
8,648,975 B2 2/2014 Saitoh
(Continued)

FOREIGN PATENT DOCUMENTS

CN 001800919 A 7/2006
CN 102906636 A 1/2013
(Continued)

OTHER PUBLICATIONS

International Search Report (Application No. PCT/IB2019/058965) dated Feb. 10, 2020.
(Continued)

*Primary Examiner* — Lucy P Chien
(74) *Attorney, Agent, or Firm* — ROBINSON INTELLECTUAL PROPERTY LAW OFFICE; Eric J. Robinson

(57) ABSTRACT

A display device with a high aperture ratio is provided. The display device includes, in a pixel, a first transistor, a second transistor, a first insulating layer, a second insulating layer, a conductive layer, a pixel electrode, a layer containing a liquid crystal material, and a common electrode. The first insulating layer is positioned over a channel formation region of the first transistor. The conductive layer is positioned over the first insulating layer. The second insulating layer is positioned over the first transistor, the second
(Continued)

transistor, the first insulating layer, and the conductive layer. The pixel electrode is positioned over the second insulating layer, the layer containing a liquid crystal material is positioned over the pixel electrode, and the common electrode is positioned over the layer containing a liquid crystal material. The common electrode overlaps with the conductive layer with the layer containing a liquid crystal material and the pixel electrode therebetween. The pixel includes a first connection portion where the conductive layer is electrically connected to the first transistor and a second connection portion where the pixel electrode is electrically connected to the second transistor. The conductive layer, the pixel electrode, and the common electrode each have a function of transmitting visible light.

16 Claims, 14 Drawing Sheets

(51) Int. Cl.
  *G02F 1/137* (2006.01)
  *C09K 19/38* (2006.01)
  *G02F 1/1343* (2006.01)
  *G02F 1/1368* (2006.01)

(52) U.S. Cl.
  CPC ...... *G02F 1/13439* (2013.01); *G02F 1/13756* (2021.01); *G02F 1/133345* (2013.01); *G02F 1/133357* (2021.01); *G02F 1/133365* (2013.01); *G02F 1/136227* (2013.01)

(56) References Cited

U.S. PATENT DOCUMENTS

| | | | |
|---|---|---|---|
| 9,298,057 | B2 | 3/2016 | Hosaka et al. |
| 10,514,579 | B2 | 12/2019 | Hosaka et al. |
| 10,514,580 | B2 | 12/2019 | Hosaka et al. |
| 10,515,609 | B2 | 12/2019 | Ikeda |
| 11,209,710 | B2 | 12/2021 | Hosaka et al. |
| 11,531,243 | B2 | 12/2022 | Hosaka et al. |
| 2003/0193457 | A1* | 10/2003 | Wang .............. G09G 3/3233 345/84 |
| 2006/0268186 | A1 | 11/2006 | Kamada et al. |
| 2007/0072439 | A1 | 3/2007 | Akimoto et al. |
| 2011/0101334 | A1 | 5/2011 | Yamazaki et al. |
| 2013/0069921 | A1 | 3/2013 | Saitoh |
| 2015/0227014 | A1* | 8/2015 | Jung .............. G02F 1/1368 349/46 |
| 2018/0005600 | A1 | 1/2018 | Ikeda |
| 2023/0093499 | A1 | 3/2023 | Hosaka et al. |

FOREIGN PATENT DOCUMENTS

| | | |
|---|---|---|
| EP | 2579094 A | 4/2013 |
| JP | 2003-271112 A | 9/2003 |
| JP | 2003-316295 A | 11/2003 |
| JP | 2006-184737 A | 7/2006 |
| JP | 2007-096055 A | 4/2007 |
| JP | 2007-123861 A | 5/2007 |
| JP | 2008-058374 A | 3/2008 |
| JP | 2008-310180 A | 12/2008 |
| JP | 2009-175564 A | 8/2009 |
| JP | 2011-119674 A | 6/2011 |
| JP | 2018-010291 A | 1/2018 |
| KR | 2006-0076705 A | 7/2006 |
| KR | 2013-0003038 A | 1/2013 |
| TW | 544944 | 8/2003 |
| TW | 200643578 | 12/2006 |
| TW | 201812418 | 4/2018 |
| TW | 201812738 | 4/2018 |
| WO | WO-2012/005038 | 1/2012 |
| WO | WO-2014/014039 | 1/2014 |
| WO | WO-2018/025996 | 2/2018 |

OTHER PUBLICATIONS

Written Opinion (Application No. PCT/IB2019/058965) dated Feb. 10, 2020.

Taiwanese Office Action (Application No. 108139433) dated Jun. 20, 2023.

* cited by examiner

DISPLAY DEVICE, DISPLAY MODULE, AND ELECTRONIC DEVICE

TECHNICAL FIELD

One embodiment of the present invention relates to a display device, a display module, and an electronic device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, and a manufacturing method thereof.

BACKGROUND ART

Flat panel displays typified by liquid crystal display devices and light-emitting display devices are widely used as display devices. Silicon is mainly used as a semiconductor material of transistors included in these display devices; recently, a technique in which a transistor using a metal oxide is used in a pixel of a display device has also been developed.

Patent Document 1 and Patent Document 2 each disclose a technique in which a transistor including a metal oxide as a semiconductor material is used for a switching element or the like in a pixel of a display device.

Patent Document 3 discloses a memory device using a transistor with an extremely low off-state current in a memory cell.

REFERENCE

Patent Document

[Patent Document 1] Japanese Published Patent Application No. 2007-123861
[Patent Document 2] Japanese Published Patent Application No. 2007-96055
[Patent Document 3] Japanese Published Patent Application No. 2011-119674

SUMMARY OF THE INVENTION

Problems to be Solved by the Invention

An object of one embodiment of the present invention is to provide a display device with a high visible-light-transmitting property. Alternatively, an object of one embodiment of the present invention is to provide a display device with a high aperture ratio. Alternatively, an object of one embodiment of the present invention is to provide a display device with low power consumption. Alternatively, an object of one embodiment of the present invention is to provide a highly reliable display device. Alternatively, an object is to provide a display device which can operate stably at a wide range of temperatures. Alternatively, an object of one embodiment of the present invention is to provide a highly convenient display device.

Note that the descriptions of these objects do not disturb the existence of other objects. One embodiment of the present invention does not need to achieve all the objects. Other objects can be derived from the descriptions of the specification, the drawings, and the claims.

Means for Solving the Problems

One embodiment of the present invention is a display device including, in a pixel, a first transistor, a second transistor, a first insulating layer, a second insulating layer, a first conductive layer, a pixel electrode, a layer containing a liquid crystal material, and a common electrode. The first insulating layer is positioned over a channel formation region of the first transistor. The first conductive layer is positioned over the first insulating layer. The second insulating layer is positioned over the first transistor, the second transistor, the first insulating layer, and the first conductive layer. The pixel electrode is positioned over the second insulating layer. The layer containing a liquid crystal material is positioned over the pixel electrode. The common electrode is positioned over the layer containing a liquid crystal material. The common electrode includes a region overlapping with the first conductive layer with the layer containing a liquid crystal material and the pixel electrode therebetween. The pixel further includes a first connection portion and a second connection portion. In the first connection portion, the first conductive layer is electrically connected to the first transistor. In the second connection portion, the pixel electrode is electrically connected to the second transistor. The first conductive layer, the pixel electrode, and the common electrode each have a function of transmitting visible light.

The pixel preferably further includes a second conductive layer. The first conductive layer and the second conductive layer are preferably positioned on the same surface. The first conductive layer and the second conductive layer are preferably electrically insulated from each other. The common electrode preferably includes a region overlapping with the second conductive layer with the layer containing a liquid crystal material and the pixel electrode therebetween, Visible-light transmittance in the layer containing a liquid crystal material is preferably higher in a state where a voltage is not applied between the pixel electrode and the common electrode than in a state where a voltage is applied between the pixel electrode and the common electrode.

The layer containing a liquid crystal material preferably includes a high molecular material. The high molecular material is preferably a copolymer of a polyfunctional monomer and a monofunctional monomer. The polyfunctional monomer preferably includes a phenyl benzoate skeleton. The monofunctional monomer preferably includes a cyclohexylbenzene skeleton.

In the first connection portion, the first transistor preferably has a function of transmitting visible light.

In the second connection portion, the second transistor preferably has a function of transmitting visible light.

The pixel preferably further includes a third conductive layer. The first conductive layer and the third conductive layer are preferably positioned on the same surface. The first conductive layer and the third conductive layer are preferably electrically insulated from each other. In the second connection portion, the pixel electrode preferably includes a region in contact with the third conductive layer and the third conductive layer preferably includes a region in contact with a source or a drain of the second transistor.

The source or the drain of the second transistor preferably has a function of transmitting visible light.

The first insulating layer is preferably positioned over the first transistor. Moreover, the first insulating layer preferably has a planarization function.

At least one of a gate, a source, and a drain of the first transistor and a gate, a source, and a drain of the second transistor preferably includes a first layer and a second layer over the first layer. The second layer preferably has a lower resistance than the first layer.

Alternatively, at least one of a gate, a source, and a drain of the first transistor and a gate, a source, and a drain of the second transistor preferably includes a first layer, a second layer over the first layer, and a third layer over the second layer. The second layer preferably has a lower resistance than the first layer and the third layer preferably has a lower visible-light reflectance than the second layer. The second layer and the third layer preferably include at least one common metal element.

The display device of one embodiment of the present invention preferably has a function of performing display by a field-sequential driving method.

One embodiment of the present invention is a display module including the display device having any of the above-described structures and a light-emitting device including a light-emitting element which are stacked. The light-emitting device has a function of displaying an image. Light emitted from the light-emitting element is extracted through the display device.

One embodiment of the present invention is a module including the display device having any of the above-described structures, where a connector such as a flexible printed circuit (hereinafter, also referred to as FPC) or a TCP (Tape Carrier Package) is attached or an integrated circuit (IC) is implemented by a COG (Chip On Glass) method, a COF (Chip On Film) method, or the like.

One embodiment of the present invention is an electronic device including the above-described display module and at least one of an antenna, a battery, a housing, a camera, a speaker, a microphone, and an operation button.

Effect of the Invention

According to one embodiment of the present invention, a display device with a high visible-light-transmitting property can be provided. Alternatively, according to one embodiment of the present invention, a display device with a high aperture ratio can be provided. Alternatively, according to one embodiment of the present invention, a display device with low power consumption can be provided. Alternatively, according to one embodiment of the present invention, a highly reliable display device can be provided. Alternatively, according to one embodiment of the present invention, a display device which can operate stably at a wide range of temperatures can be provided. Alternatively, according to one embodiment of the present invention, a highly convenient display device can be provided.

Note that the descriptions of these effects do not disturb the existence of other effects. One embodiment of the present invention does not need to have all the effects. Other effects can be derived from the descriptions of the specification, the drawings, and the claims.

MODE FOR CARRYING OUT THE INVENTION

Figure 1A:
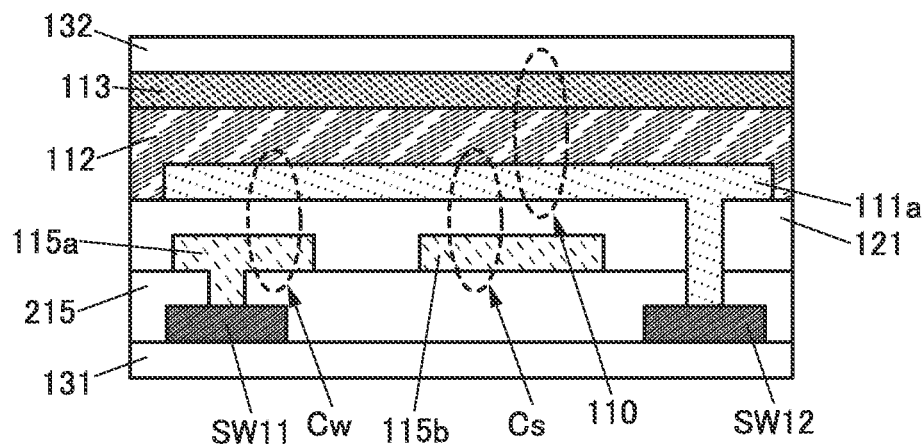
FIG. 1A and FIG. 1B are cross-sectional views showing examples of display devices.

Embodiments are described in detail with reference to the drawings. Note that the present invention is not limited to the following description, and it is be readily appreciated by those skilled in the art that modes and details of the present invention can be modified in various ways without departing from the spirit and scope of the present invention. Thus, the present invention should not be construed as being limited to the descriptions in the following embodiments.

Note that in structures of the present invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

Embodiment 1

In this embodiment, a display device and a display module of embodiments of the present invention are described with reference to FIG. 1 to FIG. 11.

The display device of one embodiment of the present invention includes at least a liquid crystal element and two transistors in one pixel. The display device of one embodiment of the present invention has a function of adding a correction signal to an image signal. The correction signal is added to an image signal by capacitive coupling, and is supplied to a liquid crystal element. Thus, the liquid crystal element can display a corrected image.

In the case where the correction signal is added to the image signal, the liquid crystal element can be driven by addition of a high voltage as compared with the case of using only the image signal. Thus, the liquid crystal element with a structure using a relatively high driving voltage can be easily driven.

Owing to the correction, the liquid crystal element can express greater gray levels than those that can be expressed by use of only image signals, for example.

Owing to the correction, the liquid crystal element can be driven at a voltage higher than the output voltage of a source driver. A voltage supplied to the liquid crystal element can be changed to a desired value in the pixel; therefore, an existing source driver can be used and the cost for designing a novel source driver can be reduced. Furthermore, an increase in output voltage of the source driver can be suppressed, so that power consumption of the source driver can be reduced.

When a liquid crystal element is driven with application of a high voltage, the display device can be used in a wide temperature range, and highly reliable display can be performed in both low temperature environment and high temperature environment. For example, the display device of one embodiment of the present invention can be used as a display device for a vehicle or a camera.

Furthermore, a liquid crystal element can be driven with application of a high voltage; thus, the response speed of the liquid crystal can be increased by overdriving in which a voltage applied to the liquid crystal element is increased temporarily so that the alignment of the liquid crystal is rapidly changed.

The correction signal is generated in an external device and written to the pixel, for example. The correction signal may be generated in real time using an external device, or a correction signal stored in a storage medium may be read and synchronized with the image signal.

In the display device of one embodiment of the present invention, an image signal supplied thereto is not changed, and a new image signal can be generated in a pixel to which a correction signal is supplied. As compared with the case where a new image signal itself is generated using an external device, load on an external device can be reduced. Furthermore, the operation for generating a new image signal in a pixel can be performed in a small number of steps and thus can be performed even in a display device with a large number of pixels and a short horizontal period.

In the display device of one embodiment of the present invention, the liquid crystal element includes a pair of electrodes and a layer containing a liquid crystal material. In the display device of one embodiment of the present invention, typically, a mode is employed in which the layer containing a liquid crystal material shows a visible-light-transmitting state when a voltage is not applied between the pair of electrodes (an off state), and the layer containing a liquid crystal material shows a visible-light-scattering state when a voltage is applied between the pair of electrodes (an on state) (this mode is also referred to as a reverse mode). Thus, the visible-light-transmitting property of the display device in a state where the display device does not display an image can be increased. Thus, the display device of one embodiment of the present invention can be used as a transparent display (also referred to as a see-through display), for example.

In the case of employing the reverse mode, the layer containing a liquid crystal material preferably contains a liquid crystal material and a high molecular material. Specifically, for the layer containing a liquid crystal material, a high-molecular liquid crystal, a polymer dispersed liquid crystal (PDLC), a polymer network liquid crystal (PNLC), a polymer-stabilized liquid crystal, or the like can be used.

In the case of employing the reverse mode, the driving voltage of the liquid crystal element tends to be relatively high. As described above, in the display device of one embodiment of the present invention, the liquid crystal element can be driven with application of a high voltage, which is a favorable structure for employing the reverse mode.

The display device of one embodiment of the present invention preferably includes at least two capacitors in one pixel. The two capacitors are each formed using a material that transmits visible light. Accordingly, the pixel can achieve a high aperture ratio and high storage capacity.

By increasing the aperture ratio of the display device (also referred to as the aperture ratio of a pixel), the display device can have an increased visible-light-transmitting property, and thus can be favorably used as a see-through display. Furthermore, a higher aperture ratio increases the light extraction efficiency (or the transmittance of the pixel). In this way, the power consumption of the display device can be reduced.

With the increase in the storage capacity of the pixel, stable display can be performed even when a liquid crystal element or the like has a large leakage current. In addition, a liquid crystal material with a high capacity can be driven. Therefore, the range of choices of the liquid crystal materials can be widened.

With the increase in the storage capacity of the pixel, the gray level of the pixel can be retained for a long time. Specifically, with the increase in the storage capacity of the pixel, an image signal that has been written in the previous period can be retained without rewriting an image signal every frame period, and for example, the gray level of the pixel can be retained for several frame periods or several ten frame periods.

A connection portion between an electrode included in the transistor and an electrode of the capacitor or the electrode of the liquid crystal element preferably has a visible-light-transmitting function. Therefore, the aperture ratio of a pixel can be increased.

The display device of one embodiment of the present invention is not necessarily provided with a polarizing plate. Accordingly, the visible-light transmittance of the display device can be increased.

The display device of one embodiment of the present invention is not necessarily provided with a light-blocking layer such as a black matrix. Therefore, the transmittance of a pixel can be increased.

<Example of Cross-Sectional Structure of Display Device>

FIG. 1A shows a cross-sectional view of a display device 10. The display device 10 illustrated in FIG. 1A includes a substrate 131, a transistor SW11, a transistor SW12, an insulating layer 215, a conductive layer 115a, a conductive layer 115b, an insulating layer 121, a pixel electrode 111a, a layer 112 containing a liquid crystal material, a common electrode 113, and a substrate 132.

The display device 10 includes a liquid crystal element 110, two transistors (the transistor SW11 and the transistor SW12), and two capacitors (a capacitor Cw and a capacitor Cs) in a pixel.

The transistor SW11 and the transistor SW12 are positioned over the substrate 131. The insulating layer 215 is positioned over the transistor SW11 and over the transistor SW12. The conductive layer 115a and the conductive layer 115b are positioned over the insulating layer 215. The insulating layer 121 is positioned over the transistor SW11, the transistor SW12, the insulating layer 215, the conductive layer 115a, and the conductive layer 115b. The pixel electrode 111a is positioned over the insulating layer 121. The layer 112 containing a liquid crystal material is positioned over the pixel electrode 111a. The common electrode 113 is positioned over the layer 112 containing a liquid crystal material. The substrate 132 is positioned over the common electrode 113.

The common electrode 113 includes a region overlapping with the conductive layer 115a with the layer 112 containing a liquid crystal material and the pixel electrode 111a therebetween. The conductive layer 115a is electrically connected to a source or a drain of the transistor SW11. The pixel electrode 111a is electrically connected to a source or a drain of the transistor SW12. The conductive layer 115a, the conductive layer 115b, the pixel electrode 111a, and the common electrode 113 each have a function of transmitting visible light.

The pixel electrode 111a, the layer 112 containing a liquid crystal material, and the common electrode 113 can function as the liquid crystal element 110. The pixel electrode 111a and the common electrode 113 are stacked with the layer 112 containing a liquid crystal material therebetween.

The conductive layer 115a, the insulating layer 121, and the pixel electrode 111a can function as one capacitor Cw. The conductive layer 115b, the insulating layer 121, and the pixel electrode 111a can function as one capacitor Cs.

The capacitance of the capacitor Cw is preferably larger than the capacitance of the capacitor Cs. For example, the area of a region where the pixel electrode 111a and the conductive layer 115a overlap with each other is preferably larger than the area of a region where the pixel electrode 111a and the conductive layer 115b overlap with each other.

Figure 1B:
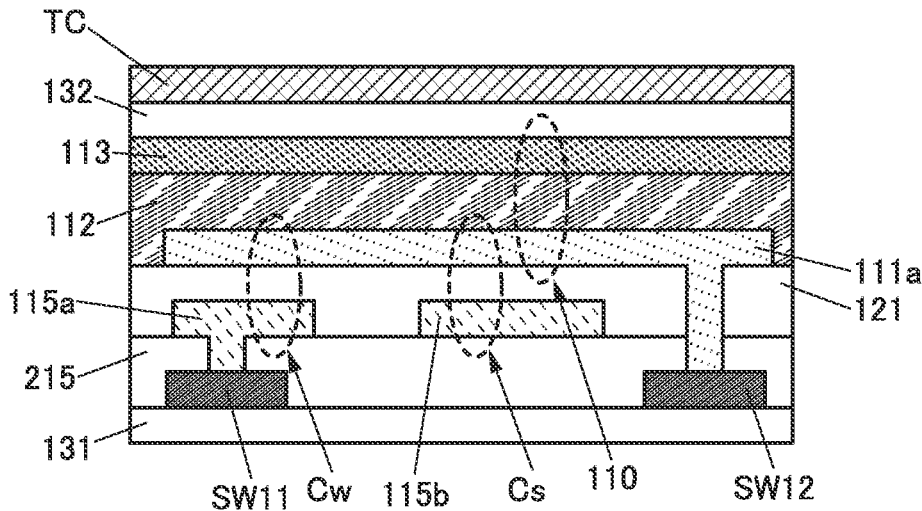

The structure of the display device 10 can be used also for a touch panel. A touch panel 11 illustrated in FIG. 1B is an example of the display device 10 illustrated in FIG. 1A including a touch sensor TC. The sensitivity of the touch sensor TC can be increased by providing the touch sensor TC on a position close to the display surface of the display device 10.

There is no particular limitation on a detection element (also referred to as a sensor element) included in the touch panel of one embodiment of the present invention. A variety of sensors capable of sensing an approach or a contact of a sensing target such as a finger or a stylus can be used as the detection element.

For example, a variety of types such as a capacitive type, a resistive type, a surface acoustic wave type, an infrared type, an optical type, and a pressure-sensitive type can be used for the sensor.

Examples of the capacitive sensor device include a surface capacitive sensor device and a projected capacitive sensor device. Examples of the projected capacitive sensor device include a self-capacitive sensor device and a mutual capacitive sensor device. The use of a mutual capacitive sensor device is preferred because multiple points can be sensed simultaneously.

The touch panel of one embodiment of the present invention can have a variety of structures, including a structure in which a display device and a detection element that are separately formed are bonded to each other and a structure in which electrodes and the like included in a detection element are provided on one or both of a substrate supporting a display element and a counter substrate.

<Circuit Structure Example of Pixel>

Figure 2:
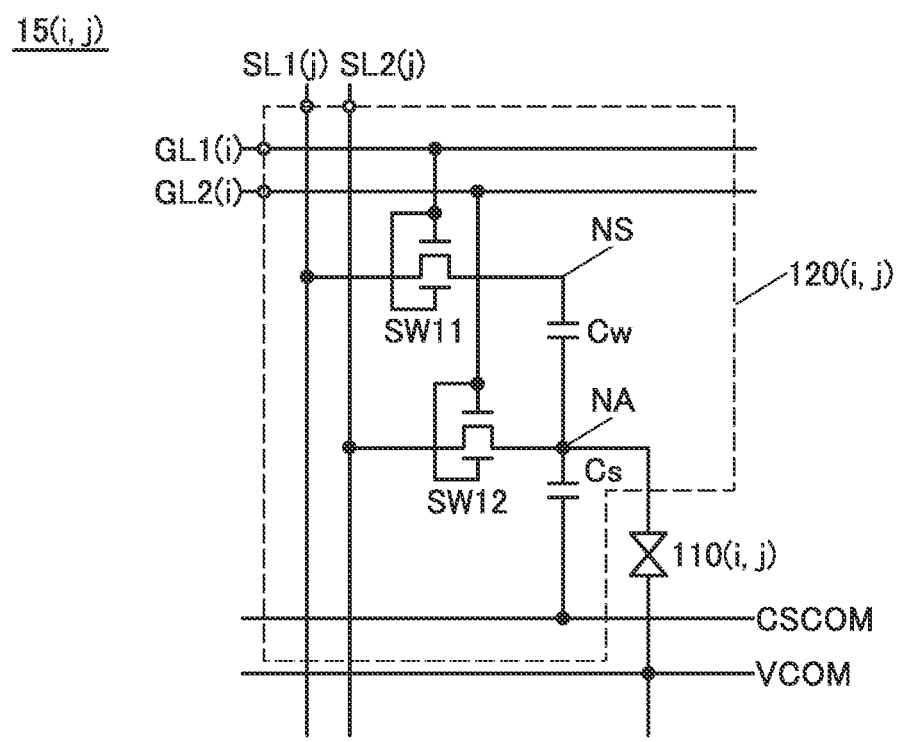
FIG. 2 is a circuit diagram showing an example of a pixel.

The display device 10 includes a plurality of pixels 15 arranged in a matrix of m rows and n columns (m and n are each an integer of 1 or more). FIG. 2 shows a circuit diagram of a pixel 15($i,j$) (i is an integer of 1 or more and m or less, and j is an integer of 1 or more and n or less).

The pixel 15($i,j$) includes the transistor SW11, the transistor SW12, the capacitor Cw, the capacitor Cs, and a liquid crystal element 110($i,j$). Note that in this specification and the like, the transistor SW11, the transistor SW12, the capacitor Cw, and the capacitor Cs are collectively referred to as a pixel circuit 120($i,j$).

One of the source and the drain of the transistor SW11 is electrically connected to one electrode of the capacitor Cw. The other electrode of the capacitor Cw is electrically connected to one of the source and the drain of the transistor SW12, one electrode of the capacitor Cs, and one electrode of the liquid crystal element 110.

Here, a node at which the one of the source and the drain of the transistor SW11 and the one electrode of the capacitor Cw are connected is referred to as a node NS. Anode at which the other electrode of the capacitor Cw, the one of the source and the drain of the transistor SW12, the one electrode of the capacitor Cs, and the one electrode of the liquid crystal element 110 are connected is referred to as a node NA.

A gate of the transistor SW11 is electrically connected to a wiring GL1($i$). A gate of the transistor SW12 is electrically connected to a wiring GL2($i$). The other of the source and the drain of the transistor SW11 is electrically connected to a wiring SL1($j$). The other of the source and the drain of the transistor SW12 is electrically connected to a wiring SL2($j$).

The other electrode of the capacitor Cs is electrically connected to a wiring CSCOM. The other electrode of the liquid crystal element 110 is electrically connected to a wiring VCOM. A given potential can be supplied to each of the wiring CSCOM and the wiring VCOM.

The wiring GL1($i$) and the wiring GL2($i$) can each be referred to as a scan line, and have a function of controlling the operation of the transistor. The wiring SL1($j$) has a function of a signal line for supplying an image signal. The wiring SL2($j$) has a function of a signal line for writing data into the node NA.

The transistors illustrated in FIG. 2 each include a back gate electrically connected to its gate; however, the connection of the back gate is not limited thereto. The transistor does not necessarily include the back gate.

When the transistor SW11 is turned off, the potential of the node NS can be retained. Furthermore, when the transistor SW12 is turned off, the potential of the node NA can be retained. When a predetermined potential is supplied to the node NS through the transistor SW11 with the transistor SW12 being in an off state, the potential of the node NA can be changed in accordance with a change of the potential of the node NS owing to capacitive coupling through the capacitor Cw.

In the pixel 15($i,j$), the correction signal written from the wiring SL2($j$) to the node NA is coupled with the image signal supplied from the wiring SL1($j$) and is supplied to the liquid crystal element 110. Thus, the liquid crystal element 110 can display a corrected image.

The use of a transistor with an extremely low off-state current as the transistor SW11 allows the potential at the node NS to be retained for a long time. Similarly, the use of a transistor with an extremely low off-state current as the transistor SW12 allows the potential at the node NA to be retained for a long time. Examples of the transistor with an extremely low off-state current include a transistor using a metal oxide for its channel formation region (hereinafter, OS transistor). A transistor containing silicon in a channel formation region (hereinafter, Si transistor) may also be used as the transistor included in the pixel. Examples of the Si transistor include a transistor containing amorphous silicon and a transistor containing crystalline silicon (typically, low-temperature polysilicon or single crystal silicon). Both an OS transistor and a Si transistor may be used.

For example, in the case where a correction signal and an image signal are rewritten every frame period, an OS transistor or a Si transistor may be used as each of the transistor SW11 and the transistor SW12. In the case where the potential of the node NS or the node NA needs to be retained for a long time, an OS transistor, rather than a Si transistor, is preferably used as the transistor SW11 and the transistor SW12.

Structure Example 1 of Display Module

Figure 3A:
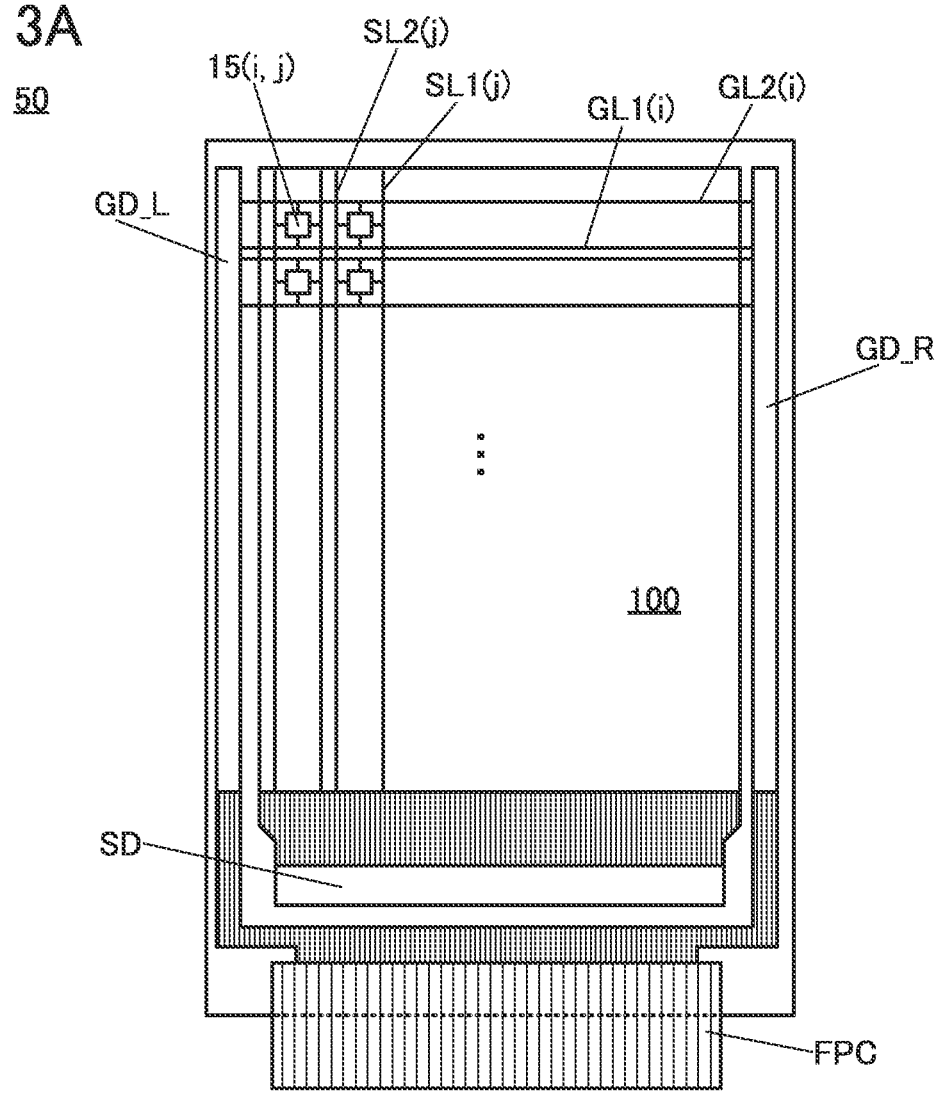
FIG. 3A is a top view showing an example of a display module.
Figure 3B:
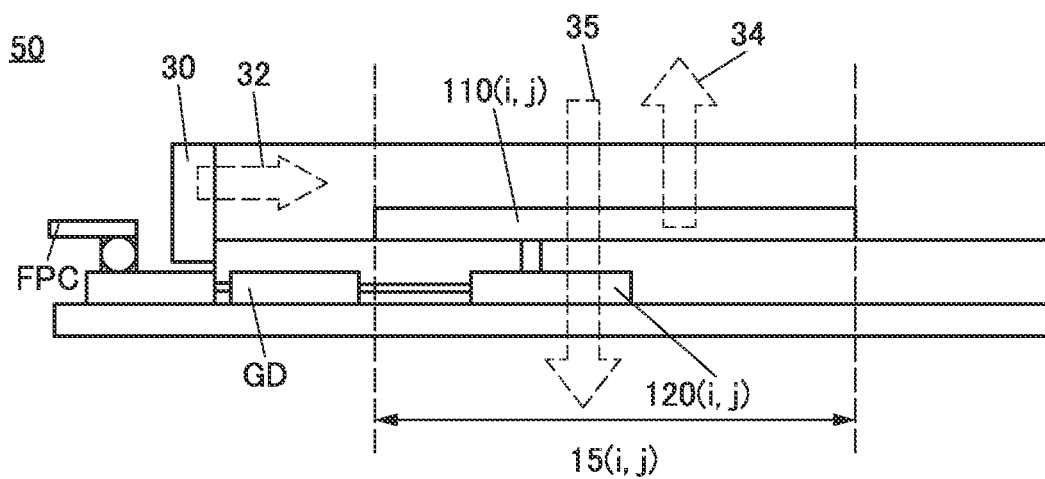
FIG. 3B is a cross-sectional view showing an example of a display module.

FIG. 3A shows a top view of a display module 50, and FIG. 3B shows a cross-sectional view of the display module 50.

The display module 50 illustrated in FIG. 3A and FIG. 3B includes a display device, a flexible printed circuit board (FPC) connected to the display device, and a light unit 30 (not illustrated in FIG. 3A).

The display device includes a display region 100, a gate driver GD_L, and a gate driver GD_R.

The display region 100 includes a plurality of pixels 15 and has a function of displaying an image.

As illustrated in FIG. 3A, the pixel 15(i,j) is electrically connected to the wiring GL1(i), the wiring GL2(i), the wiring SL1(j), and the wiring SL2(j).

As illustrated in FIG. 3B, the pixel 15(i,j) has a structure in which the pixel circuit 120(i,j) and the liquid crystal element 110(i,j) that are illustrated in FIG. 2 are stacked. The pixel circuit 120(i,j) is electrically connected to a gate driver GD (corresponding to the gate driver GD_L and the gate driver GD_R illustrated in FIG. 3A).

The display module 50 can display an image by controlling scattering or transmission of light in the liquid crystal element 110(i,j). Specifically, the liquid crystal element 110(i,j) scatters light 32 emitted from the light unit 30 and emits scattered light 34 to the outside, so that the display module 50 can display an image.

The light unit 30 includes at least a light source. As the light source, an LED (Light Emitting Diode), an organic EL (Electroluminescence) element, or the like can be used. As the light source, for example, an LED of three colors of red, green, and blue can be used.

The light unit 30 may include one or both of a structure body having a light guide function and a structure body having a light diffusion function. For example, the light unit 30 may include at least one of a light guide plate (also referred to as a light guide), a luminance increasing film, a light diffusion film, and a light diffusion plate. For example, light emitted from the light source preferably enters the display device through the light guide plate and the light diffusion film.

The display module 50 uses an edge-lit light as the light source, so that a visible-light-transmitting region in the display device can be enlarged and the visible-light-transmitting property of the display device can be increased compared to the case of using a direct-below backlight. Thus, the view behind the display module 50 can be seen through the display module 50. For example, as illustrated in FIG. 3B, at least part of external light 35 that enters the pixel 15(i,j) passes through the display module 50 and is emitted to the outside of the display module 50.

The display device of one embodiment of the present invention preferably has a function of performing display by a field-sequential driving method. A field-sequential driving method is a driving method that performs color display by time division. Specifically, light-emitting elements of red, green, blue, and the like are sequentially emitted at different timings, and the pixels are driven in synchronization with the above, so that color display is performed on the basis of a successive additive color mixing method.

In the case where a field-sequential driving method is employed, one pixel does not need to include subpixels of different colors; thus, the aperture ratio of a pixel can be increased. Moreover, the resolution of the display device can be increased. In addition, since a coloring layer such as a color filter does not need to be provided, light is not absorbed by the coloring layer, so that the transmittance of a pixel can be improved. Accordingly, required luminance can be obtained with low power; thus, low power consumption is possible. Furthermore, the manufacturing process of the display device can be simplified and the manufacturing cost can be reduced.

In the case where a field-sequential driving method is employed, a high frame frequency is required. Since the display device of one embodiment of the present invention includes two capacitors in one pixel, the storage capacity of the pixel can be increased and a high voltage can be supplied to a liquid crystal element; thus, the response speed of the liquid crystal element can be increased. For example, the response speed of the liquid crystal element can be improved by overdriving in which a voltage applied to a liquid crystal element is temporarily increased so that the alignment of liquid crystals is changed rapidly. Therefore, it can be said that the display device of one embodiment of the present invention is suitable in application of a field-sequential driving method in which a high frame frequency is required.

In addition, the display device of one embodiment of the present invention may perform monochromatic display. Also in a display device that performs monochromatic display, one pixel does not need to include subpixels of different colors; thus, the aperture ratio of a pixel can be increased. Moreover, the resolution of the display device can be increased. In addition, since a coloring layer such as a color filter does not need to be provided, light is not absorbed by the coloring layer, so that the transmittance of a pixel can be improved. Accordingly, required luminance can be obtained with low power; thus, low power consumption is possible. Furthermore, the manufacturing process of the display device can be simplified and the manufacturing cost can be reduced.

Alternatively, in the display device of one embodiment of the present invention, one pixel may include subpixels of different colors. A full-color image can be displayed in the display region 100 when one pixel unit is composed of a subpixel exhibiting a red color, a subpixel exhibiting a green color, and a subpixel exhibiting a blue color, for example. Note that the colors exhibited by subpixels are not limited to red, green, and blue. For example, a subpixel exhibiting a color such as white, yellow, magenta, or cyan may be used for the pixel unit.

The display device may incorporate one or more of a scan line driver circuit (a gate driver), a signal line driver circuit (a source driver), and a driver circuit for a touch sensor. One or more of these may be externally attached. The display module 50 illustrated in FIG. 3A and FIG. 3B has a structure in which a gate driver is incorporated and an integrated circuit (IC) including a source driver is externally provided.

The gate driver GD_L and the gate driver GD_R are provided to face each other with the display region 100 therebetween. Selection signals are supplied to the wiring GL1(i) from both the gate driver GD_L and the gate driver GD_R at the same time. Similarly, selection signals are supplied to the wiring GL2(i) from both the gate driver GD_L and the gate driver GD_R at the same time. Selection signals are supplied to one wiring from both the gate driver GD_L and the gate driver GD_R at the same time, whereby the supply capability of the selection signals to the wiring can be increased. Note that one of the gate driver GD_L and the gate driver GD_R may be omitted depending on the purpose or the like.

Signals and power are supplied from the outside to the gate driver GD_L and the gate driver GD_R through the FPC.

A source driver SD is electrically connected to a terminal of the display device by a COG (Chip on glass) method, a COF (Chip on Film) method, or the like. A signal such as an image signal or a correction signal is supplied from the source driver SD to each of the wiring SL1(j) and the wiring SL2(j).

<<Top Surface Layout Example 1 of Pixel>>

Figure 4:
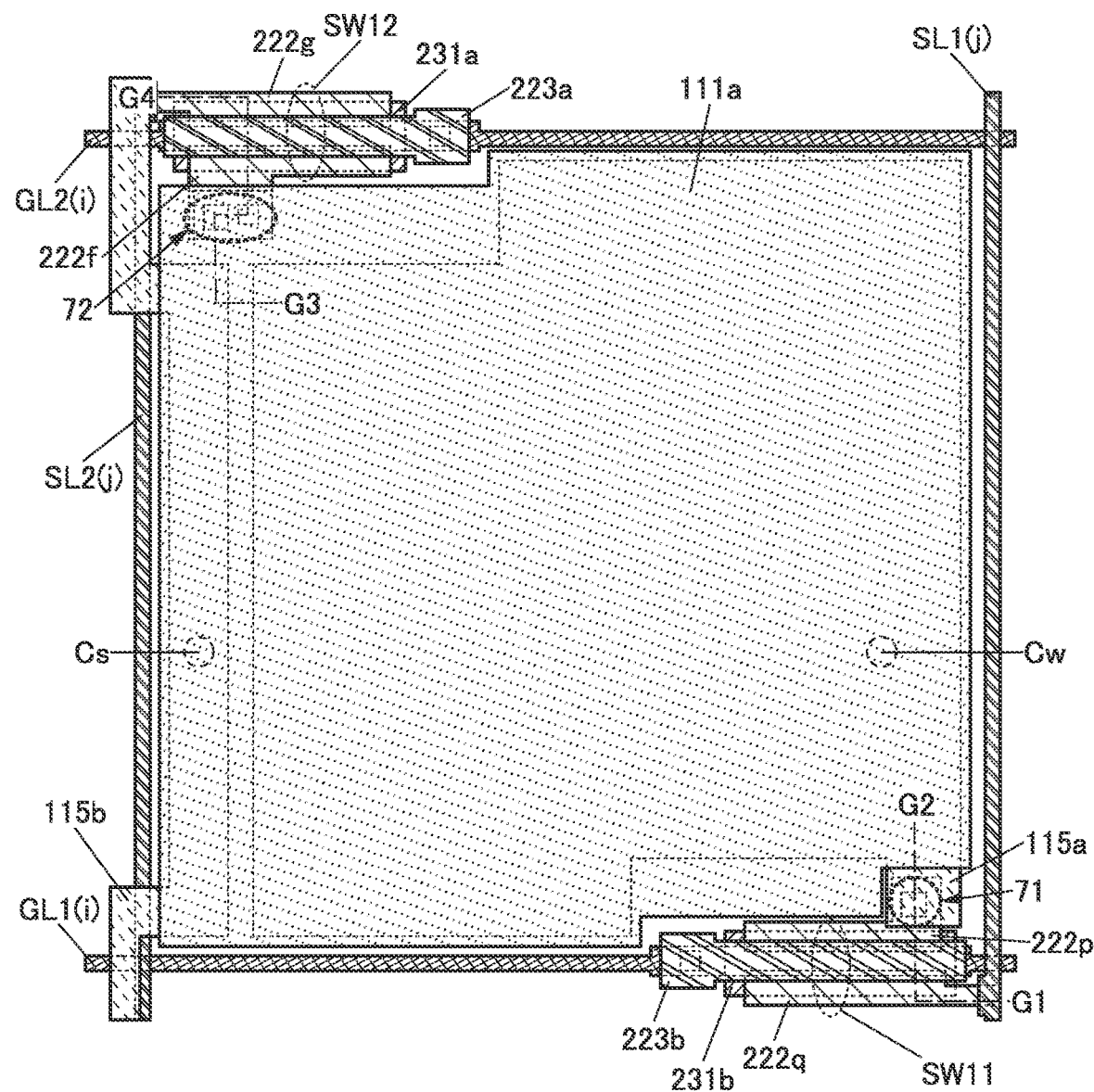
FIG. 4 is a top view showing an example of a pixel.
Figure 5:
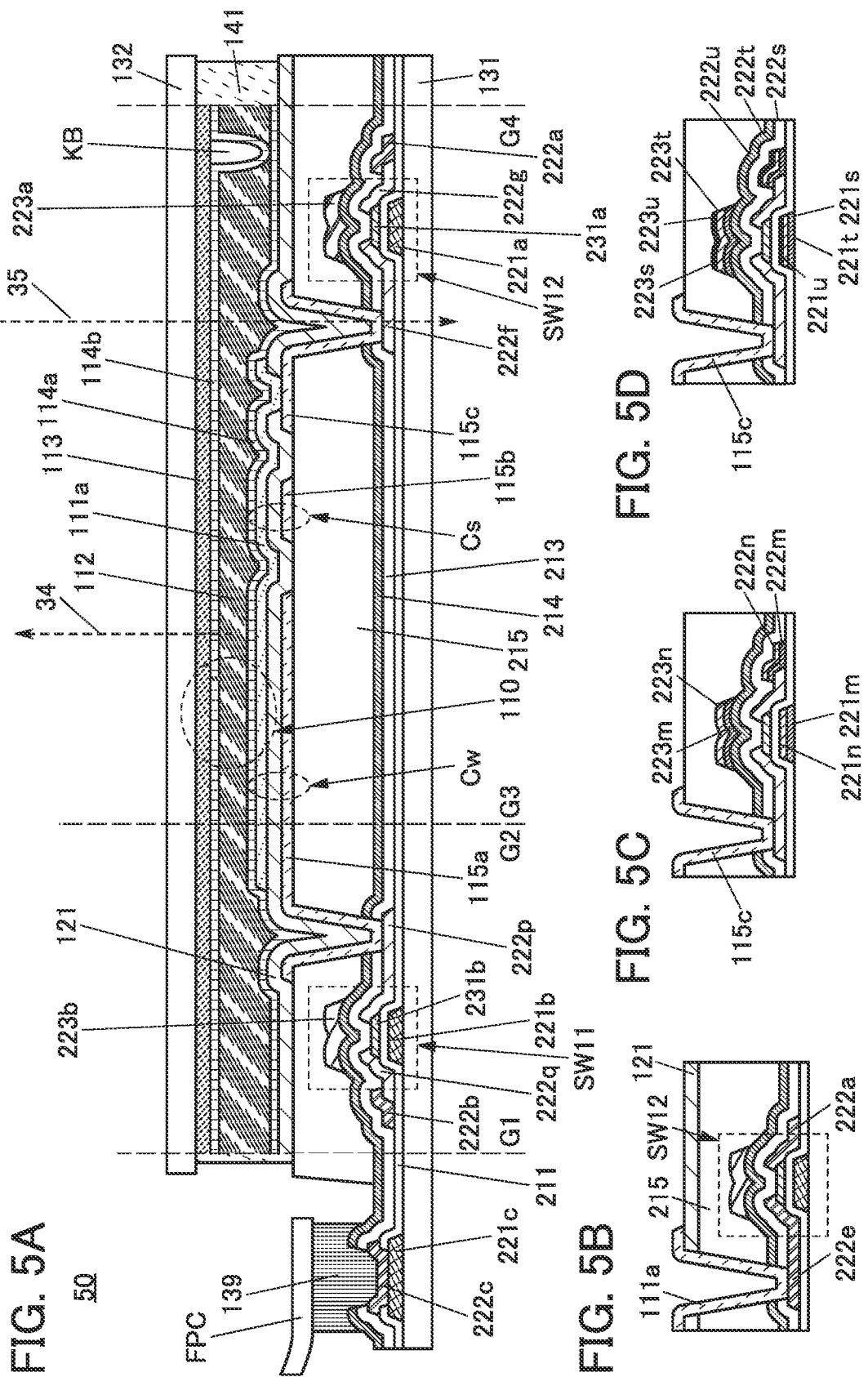
FIG. 5A, FIG. 5B, FIG. 5C, and FIG. 5D are cross-sectional views showing an example of a display module.

FIG. 4 shows a top view of the pixel 15(i,j). FIG. 4 is a top view in which a stacked structure from the wiring GL1(i) to the pixel electrode 111a is seen from the pixel electrode 111a side.

The pixel includes a connection portion 71 and a connection portion 72. In the connection portion 71, the conductive layer 115a is electrically connected to the transistor SW11. Specifically, the conductive layer 115a is electrically connected to a conductive layer 222p. In the connection portion 72, the pixel electrode 111a is electrically connected to the transistor SW12. Specifically, the pixel electrode 111a is electrically connected to a conductive layer 222f.

The connection portion 71 and the connection portion 72 each preferably include a visible-light-transmitting region. When a conductive material that transmits visible light is used for the conductive layer functioning as the source or the drain of each of the transistor SW11 and the transistor SW12 (in FIG. 4, the conductive layer 222p and the conductive layer 222f), a visible-light-transmitting region can be provided in each of the connection portion 71 and the connection portion 72, leading to an increase in the aperture ratio of the pixel 15(i,j). As a result, the visible-light-transmitting property of the display device 10 can be increased. Furthermore, the visible-light-transmitting region of the pixel 15(i,j) can be enlarged.

As illustrated in FIG. 4, the wiring SL1(j) functioning as a signal line is electrically connected to a semiconductor layer 231b through a conductive layer 222q. Note that it is also possible that the conductive layer 222q is not provided and the wiring SL1(j) and the semiconductor layer 231b are in contact with each other.

Similarly, the wiring SL2(j) functioning as a signal line is electrically connected to a semiconductor layer 231a through a conductive layer 222g. Note that it is also possible that the conductive layer 222g is not provided and the wiring SL2(j) and the semiconductor layer 231a are in contact with each other.

The resistivity of the conductive material that transmits visible light is sometimes higher than that of a conductive material that blocks visible light, such as copper or aluminum. A bus line such as a scan line or a signal line is preferably formed using a conductive material (metal material) with low resistivity, such as copper or aluminum, to prevent signal delay. Accordingly, a reduction in the width of the bus line or a reduction in the thickness of the bus line is possible. Note that the conductive material that transmits visible light can be used for the bus line, depending on the size of a pixel, the width of the bus line, the thickness of the bus line, and the like.

Specifically, the wiring SL1(j) and the wiring SL2(j) each functioning as a signal line is preferably formed using a conductive material with low resistivity. Moreover, the wiring GL1(i) and the wiring GL2(i) each functioning as a gate and a scan line is preferably formed using a conductive material with low resistivity. As a conductive material with low resistivity, a metal, an alloy, or the like can be used. A gate 223a and a gate 223b each functioning as a back gate may be formed using a conductive material that blocks visible light.

When a conductive layer blocking visible light is used as each of the gate 223a and the gate 223b, irradiation of channel formation regions of the semiconductor layer 231a and the semiconductor layer 231b with light from the light source and external light can be inhibited. The overlapping of the channel formation region of the semiconductor layer and the conductive layer blocking visible light can reduce variations in the characteristics of the transistor due to light. Thus, the transistor can have higher reliability.

Alternatively, a metal oxide may be used for the gate 223a and the gate 223b. When a metal oxide is used for the gate 223a and the gate 223b, oxygen extraction from the channel formation regions of the semiconductor layer 231a and the semiconductor layer 231b can be inhibited. Thus, the transistor can have higher reliability.

<<Cross-Sectional Structure Example 1 of Display Module>>

FIG. 5A shows a cross-sectional view of the display module 50. The pixel portion corresponds to cross-sectional views taken along dashed-dotted line G1-G2 and dashed-dotted line G3-G4 illustrated in FIG. 4.

The display module 50 illustrated in FIG. 5A has a structure in which an FPC is connected to a display device.

The display module of one embodiment of the present invention does not include a polarizing plate and thus has a high visible-light transmittance. Although a light source is not illustrated in cross-sectional views shown in FIG. 5A and the subsequent drawings, the display module of one embodiment of the present invention uses an edge-lit light, so that a visible-light-transmitting region in the display module can be enlarged compared to the case of using a direct-below backlight. Thus, the visible-light-transmitting property of the display module of one embodiment of the present invention is high and the view behind the display module can be seen through the display module.

The display module 50 illustrated in FIG. 5A includes the substrate 131, the substrate 132, the transistor SW11, the transistor SW12, the insulating layer 215, the conductive layer 115a, the conductive layer 115b, a conductive layer 115c, the insulating layer 121, the pixel electrode 111a, the layer 112 containing a liquid crystal material, the common electrode 113, an alignment film 114a, an alignment film 114b, an adhesive layer 141, a spacer KB, and the like.

The display module 50 can display a color image using the field-sequential driving method. Thus, the display module 50 illustrated in FIG. 5A does not include a coloring layer such as a color filter. Furthermore, the display module 50 does not include a light-blocking layer such as a black matrix. Therefore, the transmittance of the pixel can be improved.

The transistor SW11 and the transistor SW12 are positioned over the substrate 131.

The transistor SW11 includes a gate 221b, a gate insulating layer 211, the semiconductor layer 231b, the conductive layer 222p, the conductive layer 222q, an insulating layer 213, an insulating layer 214, and the gate 223b. One of the conductive layer 222p and the conductive layer 222q functions as a source, and the other functions as a drain. The insulating layer 213 and the insulating layer 214 function as a gate insulating layer. Furthermore, a conductive layer 222b may be a component of the transistor SW11. The conductive layer 222b is connected to the conductive layer 222q.

Here, the gate 221b and the wiring GL1(i) are formed using the same conductive layer. It can be said that one conductive layer includes a portion functioning as the gate 221b and a portion functioning as the wiring GL1(i). The conductive layer 222b corresponds to part of the wiring SL1(j).

The transistor SW12 includes a gate 221a, the gate insulating layer 211, the semiconductor layer 231a, the conductive layer 222f, the conductive layer 222g, the insulating layer 213, the insulating layer 214, and the gate 223a. One of the conductive layer 222f and the conductive layer 222g functions as a source and the other functions as a drain. The insulating layer 213 and the insulating layer 214 function as a gate insulating layer. Furthermore, a conductive layer 222a may be a component of the transistor SW12. The conductive layer 222a is connected to the conductive layer 222g.

Here, the gate 221a and the wiring GL2(i) are formed using the same conductive layer. It can be said that one conductive layer includes a portion functioning as the gate 221a and a portion functioning as the wiring GL2(i). The conductive layer 222a corresponds to part of the wiring SL2(j).

The conductive layers 222f, 222g, 222p, and 222q are formed using a material that transmits visible light. Thus, at least part of the external light 35 illustrated in FIG. 5A passes through a connection portion between the conductive layer 222f and the conductive layer 115c (corresponding to the connection portion 72 in FIG. 4) and is emitted to the outside of the display module. Similarly, a connection portion between the conductive layer 222p and the conductive layer 115a (corresponding to the connection portion 71 in FIG. 4) can transmit visible light. This can increase the aperture ratio of the pixel and increase the visible-light-transmitting property of the display module.

As illustrated in FIG. 5B, the source and the drain of the transistor may be formed using a material that blocks visible light. A conductive layer 222e can be formed using the same material and the same process as those for the conductive layer 222a.

As illustrated in FIG. 5B, the pixel electrode 111a and the source or the drain of the transistor (here, the conductive layer 222e) may be directly connected to each other without the conductive layer 115c therebetween.

As illustrated in FIG. 5C and FIG. 5D, the gate of the transistor may have a stacked-layer structure. Furthermore, the source and the drain of the transistor and wirings such as a scan line and a signal line can also have a stacked-layer structure. The electrodes of the transistor and the wirings electrically connected to the transistor preferably have a low resistance. For example, a metal material with a low resistivity such as copper or aluminum is preferably used for these electrodes and wirings.

Here, in the case of using copper, adhesion may be low depending on the material of a base (such as a substrate or an insulating layer); thus, a copper film is preferably stacked over a film having high adhesion to the base. In addition, a film having a high barrier property and a copper film are preferably stacked to inhibit diffusion of copper into another layer.

A gate 221m, a conductive layer 222m, and a gate 223m illustrated in FIG. 5C preferably contain at least one of titanium, molybdenum, manganese, and aluminum. A gate 221n, a conductive layer 222n, and a gate 223n preferably contain one or both of copper and aluminum.

Note that the materials of the gates 221m and 221n, the conductive layers 222m and 222n, and the gates 223m and 223n are not limited to those described above. For example, the gate 221n preferably has a lower resistance than the gate 221m. For example, the conductive layer 222n preferably has a lower resistance than the conductive layer 222m. For example, the gate 223n preferably has a lower resistance than the gate 223m.

A metal material has high reflectivity in some cases. Thus, it is preferable to perform oxidation treatment or the like on a surface of a metal film to reduce its reflectivity. Thus, when the display module is seen from the display surface side, a decrease in visibility due to the reflection of external light can be suppressed.

A gate 221s, a conductive layer 222s, and a gate 223s illustrated in FIG. 5D preferably contain at least one of titanium, molybdenum, manganese, and aluminum. A gate 221t, a conductive layer 222t, and a gate 223t preferably contain copper. A gate 221u, a conductive layer 222u, and a gate 223u preferably contain copper oxide.

Note that the materials of the gates 221s, 221t, and 221u, the conductive layers 222s, 222t, and 222u, and the gates 223s, 223t, and 223u are not limited to those described above. For example, the gate 221t preferably has a lower resistance than the gate 221s. The conductive layer 222t preferably has a lower resistance than the conductive layer 222s. The gate 223t preferably has a lower resistance than the gate 223s. The gate 221u preferably has a lower visible-light reflectance than the gate 221t. The conductive layer 222u preferably has a lower visible-light reflectance than the conductive layer 222t. The gate 223u preferably has a lower visible-light reflectance than the gate 223t. The gate 221t and the gate 221u preferably contain at least one common metal element. The conductive layer 222t and the conductive layer 222u preferably contain at least one common metal element. The gate 223t and the gate 223u preferably contain at least one common metal element.

Although FIG. 5A shows an example in which the transistors SW11 and SW12 include the back gates (the gates 223a and 223b in FIG. 5A), the back gates are not necessarily included.

As illustrated in FIG. 4, the two gates of the transistor are preferably electrically connected to each other. A transistor with two gates that are electrically connected to each other can have higher field-effect mobility and thus have a higher on-state current than other transistors. Consequently, a circuit capable of high-speed operation can be fabricated. Furthermore, the area occupied by a circuit portion can be reduced. The use of the transistor having a high on-state current can reduce signal delay in each wiring and can suppress display unevenness even in a display device in which the number of wirings is increased because of an increase in size or an increase in resolution. In addition, the area occupied by a circuit portion can be reduced, whereby the bezel of the display device can be narrowed. Moreover, with such a structure, a highly reliable transistor can be fabricated.

In this embodiment, an example in which a metal oxide is used for the semiconductor layer 231a and the semiconductor layer 231b is described.

The gate insulating layer 211 and the insulating layer 213 that are in contact with the semiconductor layers 231a and 231b are preferably oxide insulating layers. In the case where the gate insulating layer 211 or the insulating layer 213 has a stacked-layer structure, at least a layer in contact with the semiconductor layers 231a and 231b is preferably an oxide insulating layer. Thus, generation of oxygen vacancies in the semiconductor layers 231a and 231b can be suppressed, and thus, the reliability of the transistor can be improved.

The insulating layer 214 is preferably a nitride insulating layer. Thus, entry of impurities into the semiconductor layers 231a and 231b can be suppressed, and the reliability of the transistor can be improved.

The insulating layer 215 preferably has a planarization function, and is preferably an organic insulating layer, for example. Note that the insulating layer 215 need not necessarily be formed, and the conductive layer 115a or the like may be formed over and in contact with the insulating layer 214.

The conductive layer 115c is positioned over the insulating layer 215, the insulating layer 121 is positioned over the conductive layer 115c, and the pixel electrode 111a is positioned over the insulating layer 121. The pixel electrode 111a is electrically connected to the conductive layer 222f. Specifically, the conductive layer 222f is in contact with the conductive layer 115c, and the conductive layer 115c is in contact with the pixel electrode 111a.

The conductive layer 115a is positioned over the insulating layer 215. The conductive layer 115a is in contact with and electrically connected to the conductive layer 222p.

The conductive layer 115a and the pixel electrode 111a partly overlap with each other with the insulating layer 121 therebetween. The conductive layer 115a, the insulating layer 121, and the pixel electrode 111a can function as one capacitor Cw.

The conductive layer 115b is positioned over the insulating layer 215. The conductive layer 115b and the pixel electrode 111a partly overlap with each other with the insulating layer 121 therebetween. The conductive layer 115b, the insulating layer 121, and the pixel electrode 111a can function as one capacitor Cs.

The display module 50 thus includes two capacitors in one pixel. As a result, the storage capacity of the pixel can be increased.

The two capacitors each include a material transmitting visible light and a region where they overlap with each other. Accordingly, the pixel can achieve a high aperture ratio and high storage capacity.

The capacitance of the capacitor Cw is preferably larger than the capacitance of the capacitor Cs. Thus, the area of a region where the pixel electrode 111a and the conductive layer 115a overlap with each other is preferably larger than the area of a region where the pixel electrode 111a and the conductive layer 115b overlap with each other.

The pixel electrode 111a is provided over the insulating layer 121. The alignment film 114a is provided over the pixel electrode 111a. The common electrode 113 is provided for the substrate 132 and the spacer KB is provided in contact with the common electrode 113. The alignment film 114b is provided to cover the spacer KB and the common electrode 113. The layer 112 containing a liquid crystal material is provided between the alignment film 114a and the alignment film 114b.

Liquid crystal materials include a positive liquid crystal material with a positive dielectric anisotropy ($\Delta\varepsilon$) and a negative liquid crystal material with a negative dielectric anisotropy. Either of the materials can be used in one embodiment of the present invention, and an optimal liquid crystal material can be used according to the employed mode and design.

In order to reduce the driving voltage of the liquid crystal element 110, the absolute value of the dielectric anisotropy ($\Delta\varepsilon$) of the liquid crystal material is preferably large. The absolute value of the dielectric anisotropy ($\Delta\varepsilon$) of a positive type is easily increased compared to that of a negative type; thus, the use of a positive liquid crystal material is preferable because the range of choices for liquid crystal materials is widened.

Large refractive index anisotropy of a liquid crystal material enhances a light scattering effect, whereby the layer 112 containing a liquid crystal material can be thin. Consequently, the driving voltage can be reduced.

In the display device of one embodiment of the present invention, the mode (the reverse mode) is preferably employed in which the layer 112 containing a liquid crystal material shows a visible-light-transmitting state when a voltage is not applied between the pair of electrodes (the pixel electrode 111a and the common electrode 113) (an off state), and the layer 112 containing a liquid crystal material shows a visible-light-scattering state when a voltage is applied between the pair of electrodes (an on state). Thus, the visible-light-transmitting property of the display module 50 in a state where the display module 50 does not display an image can be increased. Thus, the display module 50 can be used as a see-through display.

In the case of employing such a mode, the layer 112 containing a liquid crystal material preferably contains a liquid crystal material and a high molecular material.

As the liquid crystal material, a nematic liquid crystal is preferably used.

The high molecular material is preferably a copolymer of a polyfunctional monomer and a monofunctional monomer.

As the monofunctional monomer, acrylate, methacrylate, or the like is given. As the polyfunctional monomer, diacrylate, triacrylate, dimethacrylate, trimethacrylate, or the like is given.

The polyfunctional monomer preferably has a phenyl benzoate skeleton. As the polyfunctional monomer, for example, diacrylate having a phenyl benzoate skeleton is given.

As the material which can be used as the polyfunctional monomer, materials represented by Structural Formulae (1) to (3) are given, for example.

[Chemical Formulae 1]

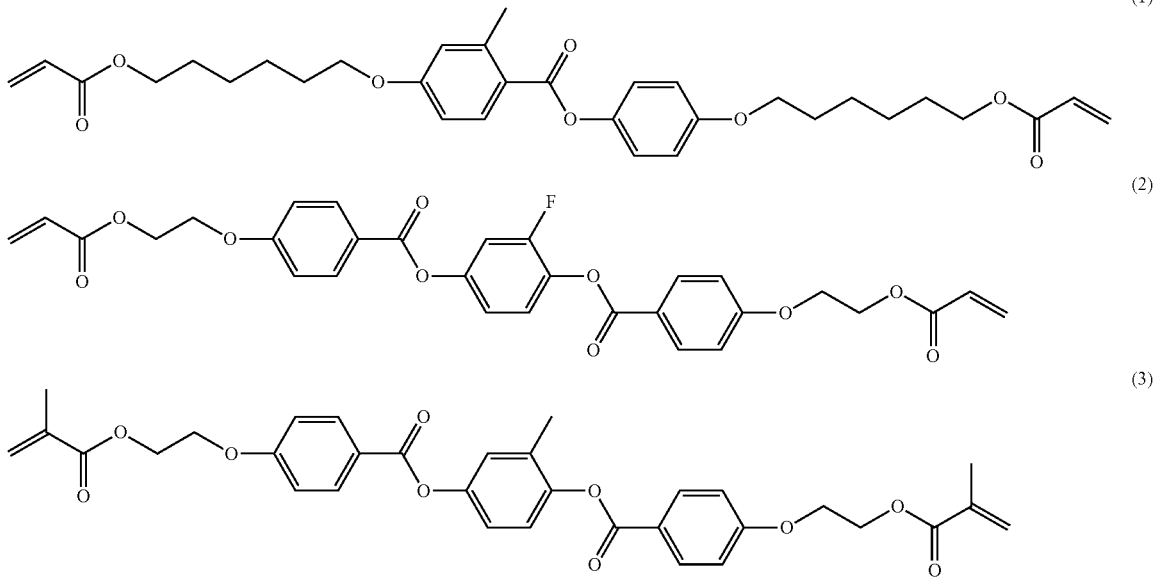

The monofunctional monomer preferably has a cyclohexylbenzene skeleton. As the monofunctional monomer, for example, acrylate having a cyclohexylbenzene skeleton is given.

As the material which can be used as the monofunctional monomer, materials represented by Structural Formulae (4) to (6) are given, for example.

[Chemical Formulae 2]

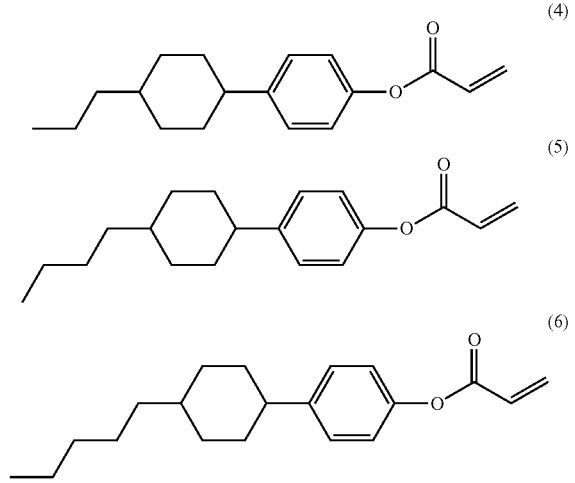

The layer 112 containing a liquid crystal material can be formed by, for example, curing a material layer containing a liquid crystal material, a monomer, and a photopolymerization initiator by light irradiation.

Note that not only the reverse mode but also various modes can be employed for the liquid crystal element used for the display device of one embodiment of the present invention.

Since the display device of this embodiment is a transmissive liquid crystal display device, a conductive material that transmits visible light is used for both of the pair of electrodes (the pixel electrode 111a and the common electrode 113). In addition, when the conductive layers 115a, 115b, and 115c are also formed using a conductive material that transmits visible light, a decrease in the aperture ratio of the pixel can be suppressed even when the capacitor Cw and the capacitor Cs are provided. For the insulating layer 121 functioning as a dielectric of the capacitor, a silicon nitride film is suitable.

For example, a material containing one or more kinds selected from indium (In), zinc (Zn), and tin (Sn) is preferably used as the conductive material transmitting visible light. Specifically, indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide containing silicon oxide (ITSO), zinc oxide, zinc oxide containing gallium, and the like are given. Note that a film containing graphene can be used as well. The film containing graphene can be formed, for example, by reducing a film containing graphene oxide.

A conductive film that transmits visible light can be formed using an oxide semiconductor (hereinafter, also referred to as an oxide conductive layer). For example, the oxide conductive layer preferably includes indium and further preferably includes an In-M-Zn oxide (M is Al, Ti, Ga, Y, Zr, La, Ce, Nd, Sn, or Hf).

An oxide semiconductor is a semiconductor material whose resistance can be controlled by oxygen vacancies in the film and/or the concentration of impurities such as hydrogen and water in the film. Thus, the resistivity of the oxide conductive layer can be controlled by selecting treatment for increasing oxygen vacancies and/or impurity concentration or treatment for reducing oxygen vacancies and/or impurity concentration, for an oxide semiconductor layer.

Note that such an oxide conductive layer formed using an oxide semiconductor can also be referred to as an oxide semiconductor layer having a high carrier density and a low resistance, an oxide semiconductor layer having conductivity, or an oxide semiconductor layer having high conductivity.

The substrate 131 and the substrate 132 are bonded to each other with the adhesive layer 141.

The FPC is electrically connected to a conductive layer 221c. Specifically, the FPC is in contact with a connector 139, the connector 139 is in contact with a conductive layer 222c, and the conductive layer 222c is in contact with the conductive layer 221c. The conductive layer 221c is formed over the substrate 131 and the conductive layer 222c is formed over the gate insulating layer 211. The conductive layer 221c can be formed using the same process and the same material as those for the gates 221a and 221b. The conductive layer 222c can be formed using the same process and the same material as those for the conductive layers 222a and 222b.

<<Touch Panel>>

In one embodiment of the present invention, a display device or display module provided with a touch sensor (hereinafter, also referred to as a touch panel) can be manufactured.

Figure 6:
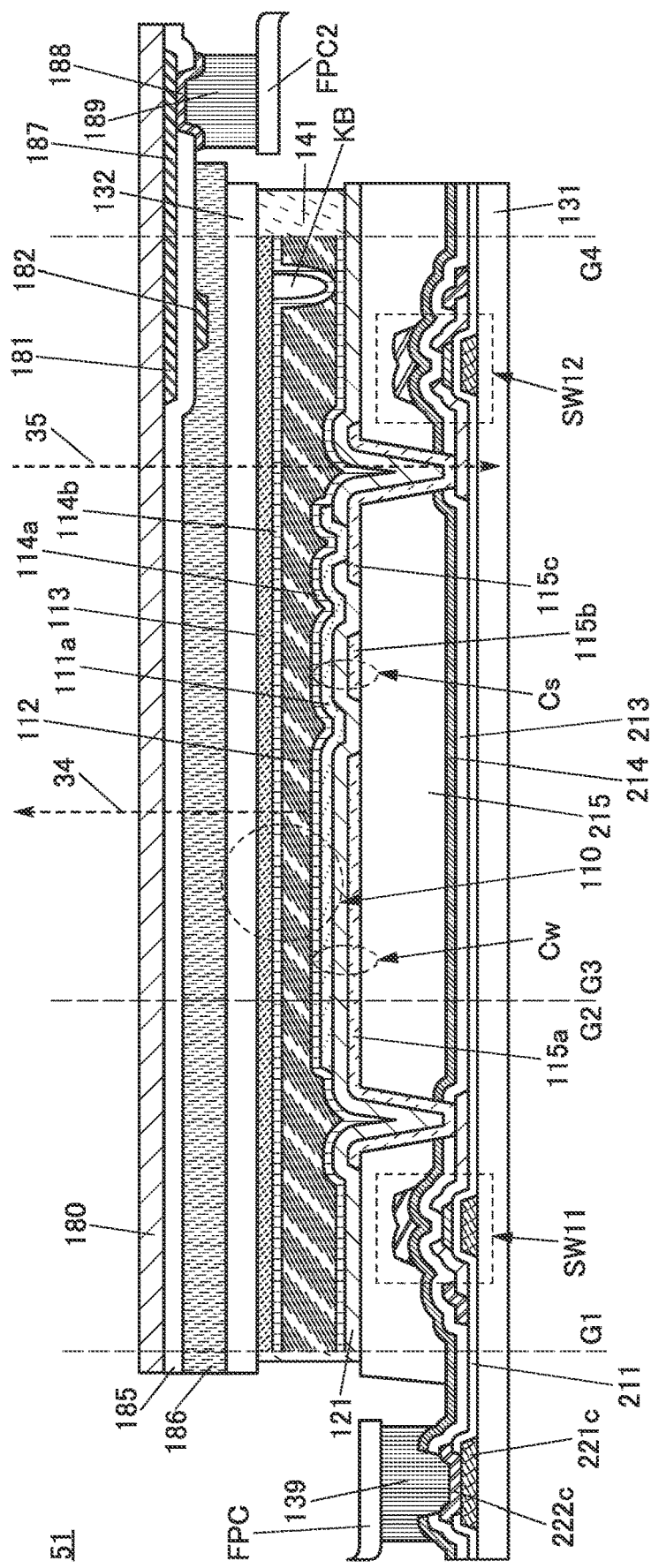
FIG. 6 is a cross-sectional view showing an example of a display module.

FIG. 6 shows a cross-sectional view of a display module 51. The display module 51 has a structure in which a touch sensor is added to the structure of the display module 50.

A substrate 180 and the substrate 132 are bonded to each other with an adhesive layer 186. An electrode 181 and an electrode 182 are provided on the substrate 132 side of the substrate 180. The electrode 181 and the electrode 182 are electrically insulated from each other by an insulating layer 185. In a region near an end portion of the substrate 180, a connection portion is provided. In the connection portion, a wiring 187 is electrically connected to an FPC2 through a conductive layer 188 and a connector 189.

In the case where the electrode and the wiring included in the touch sensor are provided in a position overlapping with an opening portion of the pixel (a portion used for display), a material that transmits visible light is used for the electrode and the wiring. In the case where the electrode and the wiring are provided in a position not overlapping with the opening portion of the pixel, a material that blocks visible light can be used for the electrode and the wiring. Thus, a material with low resistivity, such as a metal, can be used for the electrodes 181 and 182. For example, a metal mesh is preferably used for the wiring and the electrode of the touch sensor. Accordingly, the resistance of the wiring and the electrode of the touch sensor can be reduced. This is preferable for a touch sensor of a large-sized display device. Note that although a metal is generally a material having a high reflectance, a metal can be darkened by being subjected to oxidation treatment or the like. Thus, even when the display device is seen from the display surface side, a decrease in visibility due to the reflection of external light can be suppressed.

The wiring and the electrode may be formed to have a stacked layer of a metal layer and a layer having a low reflectance (hereinafter, referred to as a "dark-colored layer"). Examples of the dark-colored layer include a layer containing copper oxide and a layer containing copper chloride or tellurium chloride. Alternatively, the dark-colored layer may be formed using a metal particle such as an Ag particle, an Ag fiber, or a Cu particle, a carbon nanoparticle such as a carbon nanotube (CNT) or graphene, a conductive high molecule such as polyethylenedioxythiophene (PEDOT), polyaniline, or polypyrrole, or the like.

<<Materials of Components>>

Next, the details of materials and the like that can be used for components of the display device and the display module of this embodiment are described.

There is no strict limitation on the material of a substrate included in the display device; a variety of substrates can be used. For example, a glass substrate, a quartz substrate, a sapphire substrate, a semiconductor substrate, a ceramic substrate, a metal substrate, a plastic substrate, or the like can be used.

The use of a thin substrate can reduce the weight and thickness of the display device. Furthermore, the use of a substrate that is thin enough to have flexibility allows a flexible display device to be obtained.

A transistor included in the display device of this embodiment may have either a top-gate structure or a bottom-gate structure. Alternatively, gate electrodes may be provided above and below a channel.

A semiconductor material used in the transistor is not particularly limited, and examples of the semiconductor material include a metal oxide having semiconductor characteristics (also referred to as an oxide semiconductor), silicon, and germanium. Examples of silicon include amorphous silicon and crystalline silicon (e.g., low-temperature polysilicon or single crystal silicon).

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. A semiconductor having crystallinity is preferably used, in which case deterioration of the transistor characteristics can be suppressed.

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

In the case where the semiconductor layer is an In-M-Zn oxide, a sputtering target used for depositing the In-M-Zn oxide preferably has the atomic proportion of In higher than or equal to the atomic proportion of M. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:6, In:M:Zn=5:1:7, In:M:Zn=5:1:8, In:M:Zn=6:1:6, and In:M:Zn=5:2:5.

A target containing a polycrystalline oxide is preferably used as the sputtering target, in which case the semiconductor layer having crystallinity is easily formed. Note that the atomic ratio in the deposited semiconductor layer may vary from the above atomic ratio between metal elements in the sputtering target in a range of ±40%. For example, in the case where the composition of a sputtering target used for the semiconductor layer is In:Ga:Zn=4:2:4.1 [atomic ratio], the composition of the semiconductor layer to be deposited is in some cases in the neighborhood of In:Ga:Zn=4:2:3 [atomic ratio].

Note that when the atomic ratio is described as In:Ga:Zn=4:2:3 or as being in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. When the atomic ratio is described as In:Ga:Zn=5:1:6 or as being in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. When the atomic ratio is described as In:Ga:Zn=1:1:1 or as being in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

The transistors included in the gate drivers GD_L and GD_R and the transistor included in the display region 100 may have the same structure or different structures. The transistors included in the gate drivers may have the same structure or the combination of two or more kinds of structures. Similarly, the transistors included in the display region 100 may have the same structure or the combination of two or more kinds of structures.

As an insulating material that can be used for the insulating layer included in the display device, an organic insulating material and an inorganic insulating material are given. Examples of the organic insulating material include an acrylic resin, an epoxy resin, a polyimide resin, a polyamide resin, a polyimide-amide resin, a siloxane resin, a benzocyclobutene-based resin, and a phenol resin. As inorganic insulating layers, a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, and the like are given.

The conductive layers for the gate, the source, and the drain of the transistor and various wirings, electrodes, and the like of the display device can have a single-layer structure or a stacked-layer structure using one or more of metals such as aluminum, titanium, chromium, nickel, copper, yttrium, zirconium, molybdenum, silver, tantalum, and tungsten, and an alloy containing at least one of these metals as its main component. For example, a two-layer structure in which a titanium film is stacked over an aluminum film; a two-layer structure in which a titanium film is stacked over a tungsten film; a two-layer structure in which a copper film is stacked over a molybdenum film; a two-layer structure in which a copper film is stacked over an alloy film containing molybdenum and tungsten; a two-layer structure in which a copper film is stacked over an alloy film containing copper, magnesium, and aluminum; a three-layer structure in which a titanium film or a titanium nitride film, an aluminum film or a copper film, and a titanium film or a titanium nitride film are stacked in this order; a three-layer structure in which a molybdenum film or a molybdenum nitride film, an aluminum film or a copper film, and a molybdenum film or a molybdenum nitride film are stacked in this order; or the like can be employed. For example, in the case where the conductive layer has a three-layer structure, it is preferable that each of the first layer and the third layer be a film formed of titanium, titanium nitride, molybdenum, tungsten, an alloy containing molybdenum and tungsten, an alloy containing molybdenum and zirconium, or molybdenum nitride, and that the second layer be a film formed of a low-resistance material such as copper, aluminum, gold, silver, or an alloy containing copper and manganese. Note that light-transmitting conductive materials such as ITO, indium oxide containing tungsten oxide, indium zinc oxide containing tungsten oxide, indium oxide containing titanium oxide, indium tin oxide containing titanium oxide, indium zinc oxide, or ITSO may be used. Note that an oxide conductive layer may be formed by controlling the resistivity of an oxide semiconductor.

A curable resin such as a heat-curable resin, a photocurable resin, or a two-component-mixture-type curable resin can be used as the adhesive layer 141. For example, an acrylic resin, a urethane resin, an epoxy resin, or a siloxane resin can be used.

As the connector 139, for example, an anisotropic conductive film (ACF) or an anisotropic conductive paste (ACP) can be used.

The thin films included in the display device (the insulating film, the semiconductor film, the conductive film, and the like) can be formed by a sputtering method, a chemical vapor deposition (CVD) method, a vacuum evaporation method, a pulsed laser deposition (PLD) method, an atomic layer deposition (ALD) method, or the like. As examples of the CVD method, a plasma enhanced chemical vapor deposition (PECVD) method, a thermal CVD method, and the like are given. As an example of the thermal CVD method, a metal organic chemical vapor deposition (MOCVD: Metal Organic CVD) method is given.

The thin films included in the display device (the insulating film, the semiconductor film, the conductive film, and the like) can each be formed by a method such as spin coating, dipping, spray coating, inkjet printing, dispensing, screen printing, offset printing, a doctor knife, slit coating, roll coating, curtain coating, or knife coating.

The thin films included in the display device can be processed using a photolithography method or the like. Alternatively, island-shaped thin films may be formed by a deposition method using a blocking mask. Alternatively, the thin films may be processed by a nanoimprinting method, a sandblasting method, a lift-off method, or the like. As a photolithography method, there are a method in which a resist mask is formed over a thin film to be processed, the thin film is processed by etching or the like, and the resist mask is removed, and a method in which a photosensitive thin film is formed, and then exposed to light and developed to be processed into a desired shape.

As light used for light exposure in a photolithography method, for example, an i-line (a wavelength of 365 nm), a g-line (a wavelength of 436 nm), an h-line (a wavelength of 405 nm), and light in which the i-line, the g-line, and the h-line are mixed are given. Alternatively, ultraviolet light, KrF laser light, ArF laser light, or the like can be used. Furthermore, exposure may be performed by liquid immersion light exposure technique. Examples of light used for light exposure include extreme ultraviolet (EUV) light and X-rays. Furthermore, instead of the light used for the exposure, an electron beam can also be used. It is preferable to use extreme ultra-violet light, X-rays, or an electron beam because extremely minute processing can be performed. Note that in the case of performing exposure by scanning of a beam such as an electron beam, a photomask is not needed.

For etching of the thin films, a dry etching method, a wet etching method, a sandblasting method, or the like can be used.

<<Metal Oxide>>

A metal oxide that can be used for the semiconductor layer will be described below.

Note that in this specification and the like, a metal oxide containing nitrogen is also collectively referred to as a metal oxide in some cases. A metal oxide containing nitrogen may be referred to as a metal oxynitride. For example, a metal oxide containing nitrogen, such as zinc oxynitride (ZnON), may be used for the semiconductor layer.

Note that in this specification and the like, "CAAC (c-axis aligned crystal)" or "CAC (Cloud-Aligned Composite)" might be stated. Note that CAAC refers to an example of a crystal structure, and CAC refers to an example of a function or a material composition.

For example, a CAC (Cloud-Aligned Composite)-OS can be used for the semiconductor layer.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) functioning as carriers to flow, and the insulating function is a function that does not allow electrons functioning as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

Oxide semiconductors (metal oxides) can be classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary is difficult to observe in the CAAC-OS; thus, it can be said that a reduction in electron mobility due to the crystal grain boundary is less likely to occur. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as Vo)). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that indium-gallium-zinc oxide (hereinafter, referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

A metal oxide film that functions as a semiconductor layer can be deposited using either or both of an inert gas and an oxygen gas. Note that there is no particular limitation on the flow rate ratio of oxygen (the partial pressure of oxygen) at the time of depositing the metal oxide film. However, to obtain a transistor having high field-effect mobility, the flow rate ratio of oxygen (the partial pressure of oxygen) at the time of depositing the metal oxide film is preferably higher than or equal to 0% and lower than or equal to 30%, further preferably higher than or equal to 5% and lower than or equal to 30%, still further preferably higher than or equal to 7% and lower than or equal to 15%.

The energy gap of the metal oxide is preferably 2 eV or more, further preferably 2.5 eV or more, still further preferably 3 eV or more. With the use of a metal oxide having such a wide energy gap, the off-state current of the transistor can be reduced.

The metal oxide film can be formed by a sputtering method. Alternatively, a PLD method, a PECVD method, a thermal CVD method, an ALD method, a vacuum evaporation method, or the like may be used.

Structure Example 2 of Display Module

Figure 7:
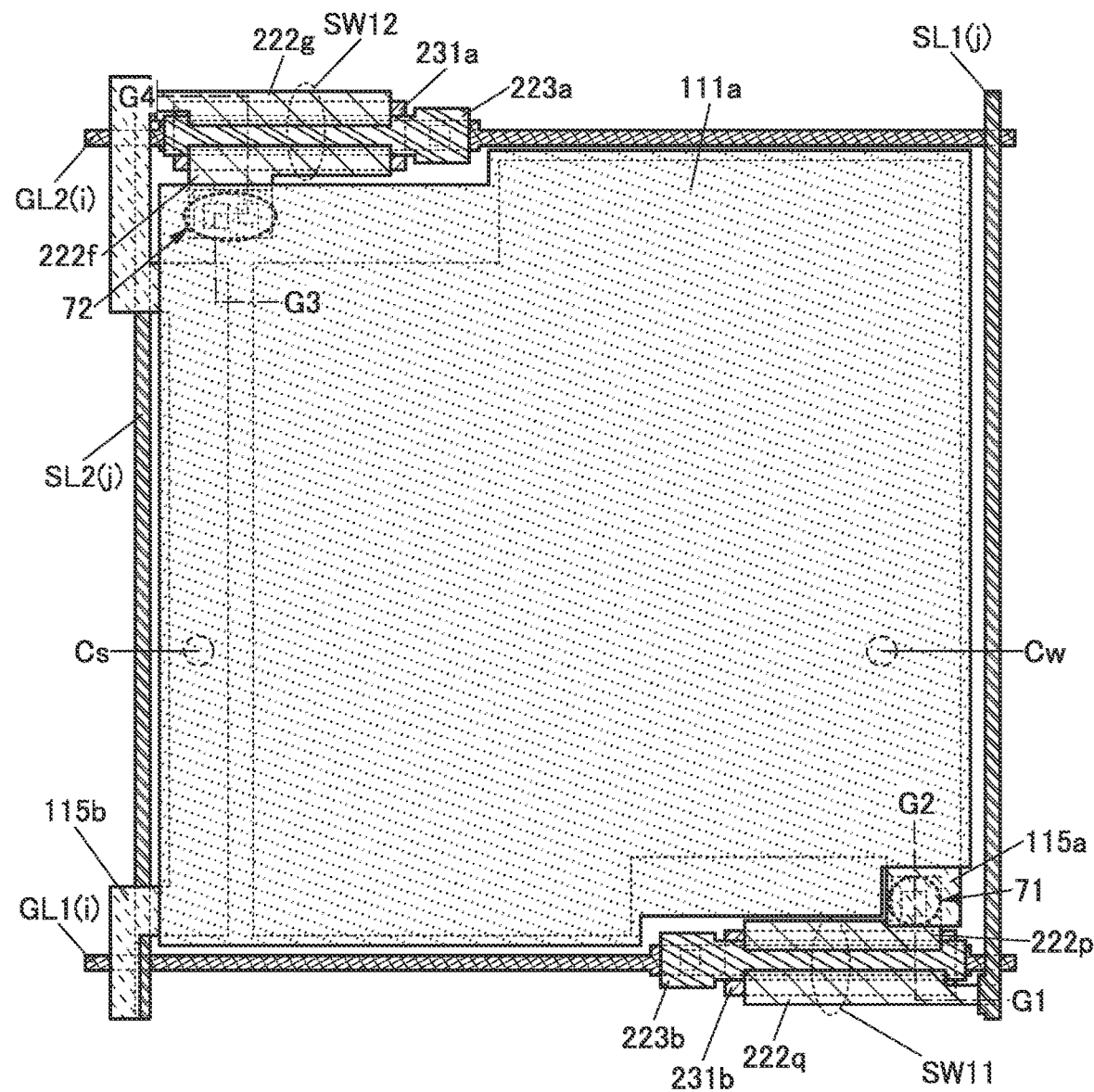
FIG. 7 is a top view showing an example of a pixel.

FIG. 7 shows a top view of a pixel 16(i,j). FIG. 7 is a top view in which a stacked structure from the wiring GL1(i) to the pixel electrode 111a is seen from the pixel electrode 111a side.

Figure 8:
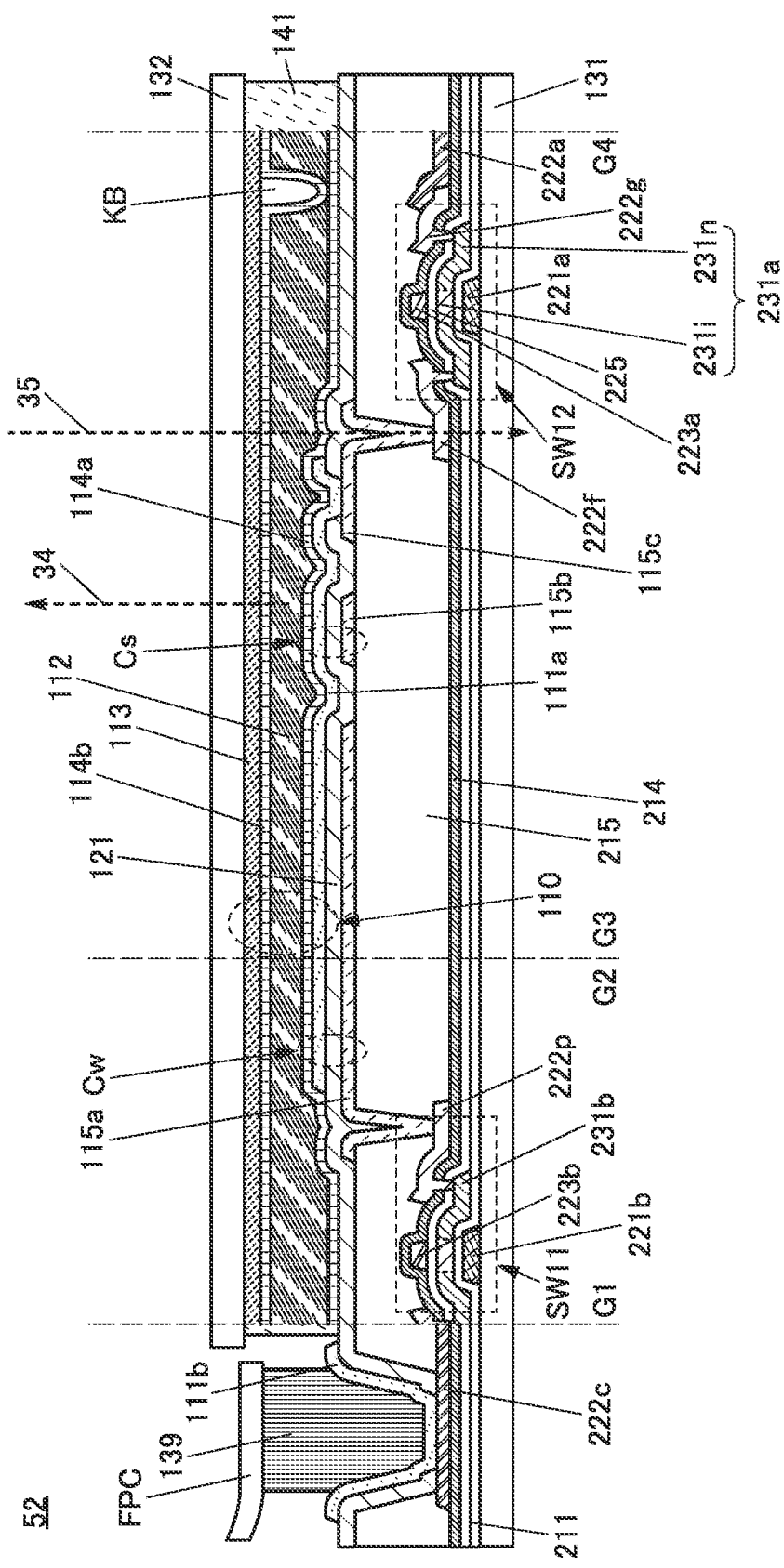
FIG. 8 is a cross-sectional view showing an example of a display module.

FIG. 8 shows a cross-sectional view of a display module 52. The pixel portion corresponds to cross-sectional views taken along dashed-dotted line G1-G2 and dashed-dotted line G3-G4 illustrated in FIG. 7.

The structures illustrated in FIG. 7 and FIG. 8 are different from the structures illustrated in FIG. 4 and FIG. 5A in the structure of the transistor. Hereinafter, description of portions common to those in the above-described structure example will be omitted in some cases.

The transistor SW11 illustrated in FIG. 7 and FIG. 8 includes the gate 221b, the gate insulating layer 211, the semiconductor layer 231b, the conductive layer 222p, the conductive layer 222q, a gate insulating layer 225, and the gate 223b. One of the conductive layer 222p and the conductive layer 222q functions as a source, and the other functions as a drain.

The transistor SW12 illustrated in FIG. 7 and FIG. 8 includes the gate 221a, the gate insulating layer 211, the semiconductor layer 231a, the conductive layer 222f, the conductive layer 222g, the gate insulating layer 225, and the gate 223a. One of the conductive layer 222f and the conductive layer 222g functions as a source and the other functions as a drain.

The semiconductor layers 231a and 231b each include a pair of low-resistance regions 231n and a channel formation region 231i sandwiched between the pair of low-resistance regions 231n.

The channel formation region 231i overlaps with the gate 221a or the gate 221b with the gate insulating layer 211 therebetween and overlaps with the gate 223a or the gate 223b with the gate insulating layer 225 therebetween.

The conductive layers 222f, 222g, 222p, and 222q are formed using a material that transmits visible light. Thus, at least part of the external light 35 illustrated in FIG. 8 passes through a connection portion between the conductive layer 222f and the conductive layer 115c (corresponding to the connection portion 72 in FIG. 7) and is emitted to the outside of the display module. Similarly, a connection portion between the conductive layer 222p and the conductive layer 115a (corresponding to the connection portion 71 in FIG. 7) can transmit visible light. This can increase the aperture ratio of the pixel and increase the visible-light-transmitting property of the display module.

As described above, in this embodiment, an example in which a metal oxide is used for the semiconductor layer 231a and the semiconductor layer 231b is described.

The gate insulating layer 211 and the gate insulating layer 225 that are in contact with the channel formation region 231i are preferably oxide insulating layers. In the case where the gate insulating layer 211 or the gate insulating layer 225 has a stacked-layer structure, at least a layer in contact with the channel formation region 231i is preferably an oxide insulating layer. Thus, generation of oxygen vacancies in the channel formation region 231i can be suppressed, and thus, the reliability of the transistor can be improved.

The insulating layer 214 is preferably a nitride insulating layer. Thus, entry of impurities into the semiconductor layers 231a and 231b can be suppressed, and the reliability of the transistor can be improved.

The insulating layer 215 preferably has a planarization function, and is preferably an organic insulating layer, for example.

Figure 9:
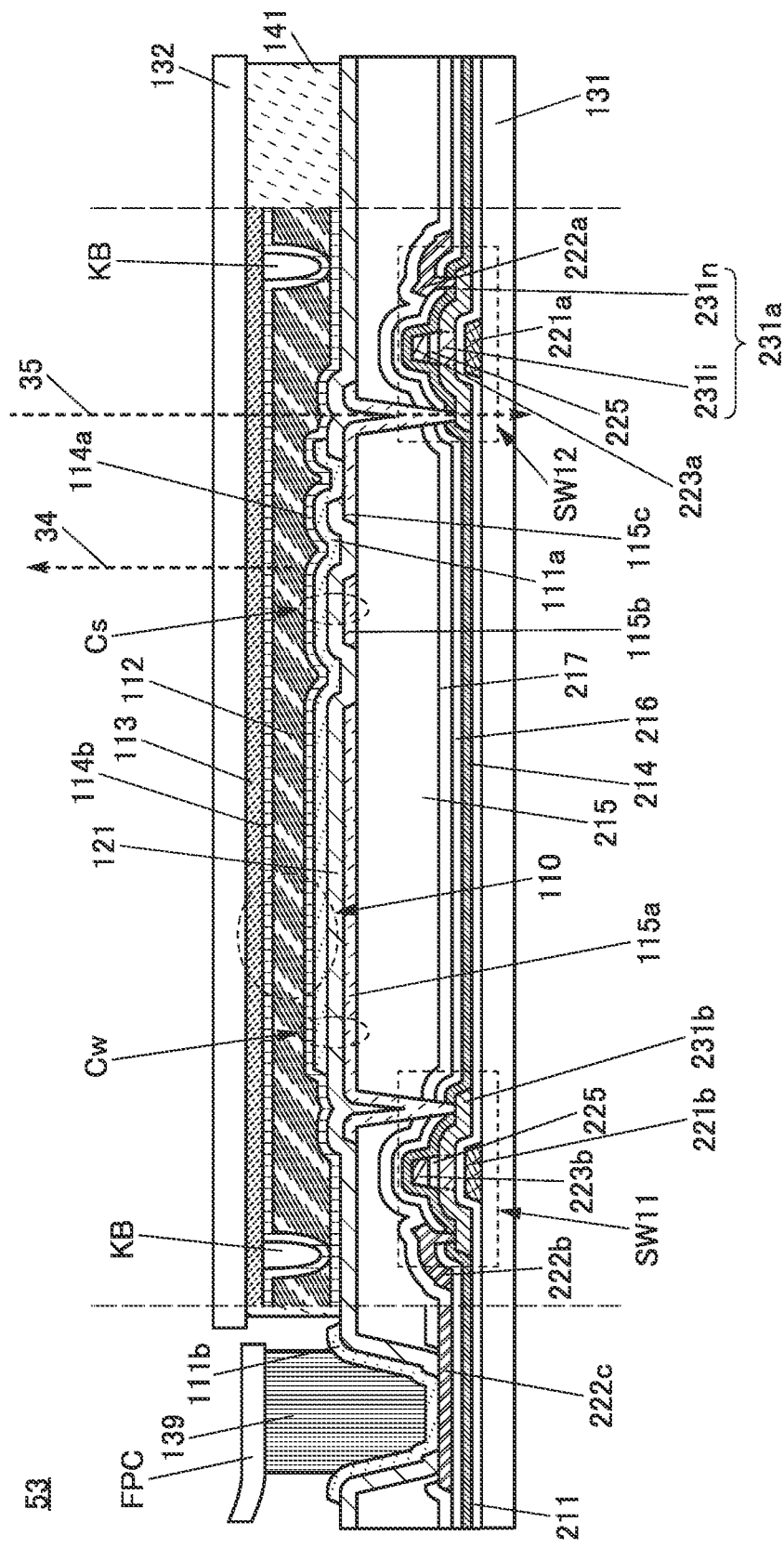
FIG. 9 is a cross-sectional view showing an example of a display module.

As illustrated in FIG. 8, the gate insulating layer 225 may overlap with both the low-resistance region 231n and the channel formation region 231i. The gate insulating layer 225 illustrated in FIG. 8 has an advantage in that the step of processing the gate insulating layer 225 with the gates 223a and 223b used as masks is not necessary, the step height of a surface on which the insulating layer 214 is formed can be lowered, and the like. Note that as illustrated in FIG. 9, it is also possible that the gate insulating layer 225 is formed only over the channel formation region 231i and does not overlap with the low-resistance region 231n.

The resistivity of the low-resistance regions 231n is lower than that of the channel formation region 231i. The low-resistance regions 231n may be formed by the addition of an impurity with the gates 223a and 223b used as masks. Examples of the impurity include hydrogen, helium, neon, argon, fluorine, nitrogen, phosphorus, arsenic, antimony, boron, aluminum, magnesium, and silicon, and the impurity can be added by an ion implantation method or an ion doping method. Other than the above impurities, for example, indium, which is a constituent element of the semiconductor layers 231a and 231b, may be added to form the low-resistance regions 231n. When indium is added, the concentration of indium in the low-resistance regions 231n is sometimes higher than that in the channel formation region 231i.

In the case where the gate insulating layer 225 is an oxide film having a function of releasing oxygen by heating, oxygen is supplied to the low-resistance regions 231n by heating, and thus a reduction in carrier density and an increase in electric resistance might be generated. Thus, impurities are preferably added to part of the semiconductor layer through the gate insulating layer 225, so that the low-resistance regions 231n are formed. Accordingly, impurities are added also to the gate insulating layer 225. The impurities are added to the oxide film having a function of releasing oxygen by heating, whereby the amount of released oxygen can be reduced. Accordingly, by heating, supply of oxygen from the gate insulating layer 225 to the low-resistance regions 231n can be suppressed, so that the low-resistance regions 231n can be kept with low electrical resistance.

Alternatively, the low-resistance regions 231n can be formed in such a manner that, after the gate insulating layer 225 and the gates 223a and 223b are formed, a first layer is formed to be in contact with regions of the semiconductor layers 231a and 231b and heat treatment is performed to lower the resistance of the regions.

For the first layer, a film containing at least one of metal elements such as aluminum, titanium, tantalum, tungsten, chromium, and ruthenium can be used. It is particularly preferable that at least one of aluminum, titanium, tantalum, and tungsten be contained. Alternatively, a nitride containing at least one of these metal elements or an oxide containing at least one of these metal elements can be suitably used. In particular, it is preferable to use a metal film such as a tungsten film or a titanium film, a nitride film such as an aluminum titanium nitride film, a titanium nitride film, or an aluminum nitride film, or an oxide film such as an aluminum titanium oxide film, for example.

The thickness of the first layer can range, for example, from 0.5 nm to 20 nm, preferably from 0.5 nm to 15 nm, further preferably from 0.5 nm to 10 nm, still further preferably 1 nm to 6 nm. Typically, the thickness can be approximately 5 nm or approximately 2 nm. With such a thin first layer, the resistance of the semiconductor layers 231a and 231b can be sufficiently lowered.

It is important that the low-resistance regions 231n are made to have a higher carrier density than the channel formation region 231i. For example, the low-resistance regions 231n can be a region having a higher hydrogen content than the channel formation region 231i, or a region containing more oxygen vacancies than the channel formation region 231i. When bonded to a hydrogen atom, an oxygen vacancy in the oxide semiconductor functions as a carrier generation source.

The heat treatment is performed while the first layer is provided in contact with regions of the semiconductor layers 231a and 231b, whereby oxygen in the regions is absorbed into the first layer, and thus, a large amount of oxygen vacancy can be generated in the regions. Thus, the low-resistance regions 231n can have an extremely low resistance.

The low-resistance regions 231n formed in the above manner have a feature in that its resistance is not likely to be increased by subsequent process. There is no possibility that the conductivity of the low-resistance regions 231n is impaired by heat treatment in an atmosphere containing oxygen or by deposition process in an atmosphere containing oxygen, for example; thus, a transistor with favorable electrical characteristics and high reliability can be fabricated.

When the first layer that has undergone the heat treatment has conductivity, the first layer is preferably removed after the heat treatment. In contrast, when the first layer has insulating properties, the first layer can function as a protective insulating film when remaining.

The FPC is electrically connected to the conductive layer 222c. Specifically, the FPC is in contact with the connector 139, the connector 139 is in contact with a conductive layer 111b, and the conductive layer 111b is in contact with the conductive layer 222c. The conductive layer 222c is formed over the insulating layer 214 and the conductive layer 111b is formed over the insulating layer 121. The conductive layer 222c can be formed using the same process and the same material as those for the conductive layer 222a and the conductive layer 222b. The conductive layer 111b can be formed using the same process and the same material as those for the pixel electrode 111a.

As illustrated in FIG. 9, the display device does not necessarily include the conductive layers 222f, 222g, 222p, and 222q that transmit visible light (see FIG. 7 and FIG. 8). Therefore, the manufacturing process of the display device can be simplified.

In FIG. 9, the conductive layer 115c and (the low-resistance region 231n of) the semiconductor layer 231a are in contact with each other and the conductive layer 115a and (the low-resistance region 231n of) the semiconductor layer 231b are in contact with each other. When a material that transmits visible light (e.g., a metal oxide) is used for the semiconductor layer 231a and the semiconductor layer 231b, for example, visible-light-transmitting regions can be provided in a contact portion between the capacitor Cw and the transistor SW11 and in a contact portion between the liquid crystal element 110 and the transistor SW12.

In FIG. 9, (the low-resistance region 231n of) the semiconductor layer 231a and the conductive layer 222a that blocks visible light are in contact with each other and (the low-resistance region 231n of) the semiconductor layer 231b and the conductive layer 222b that blocks visible light are in contact with each other.

In FIG. 9, the low-resistance regions 231n are regions of the semiconductor layers 231a and 231b that are in contact with the insulating layer 214. The insulating layer 214 preferably includes nitrogen or hydrogen. Accordingly, nitrogen or hydrogen in the insulating layer 214 enters the low-resistance regions 231n to increase the carrier concentration of the low-resistance regions 231n.

Structure Example 3 of Display Module

Figure 10:
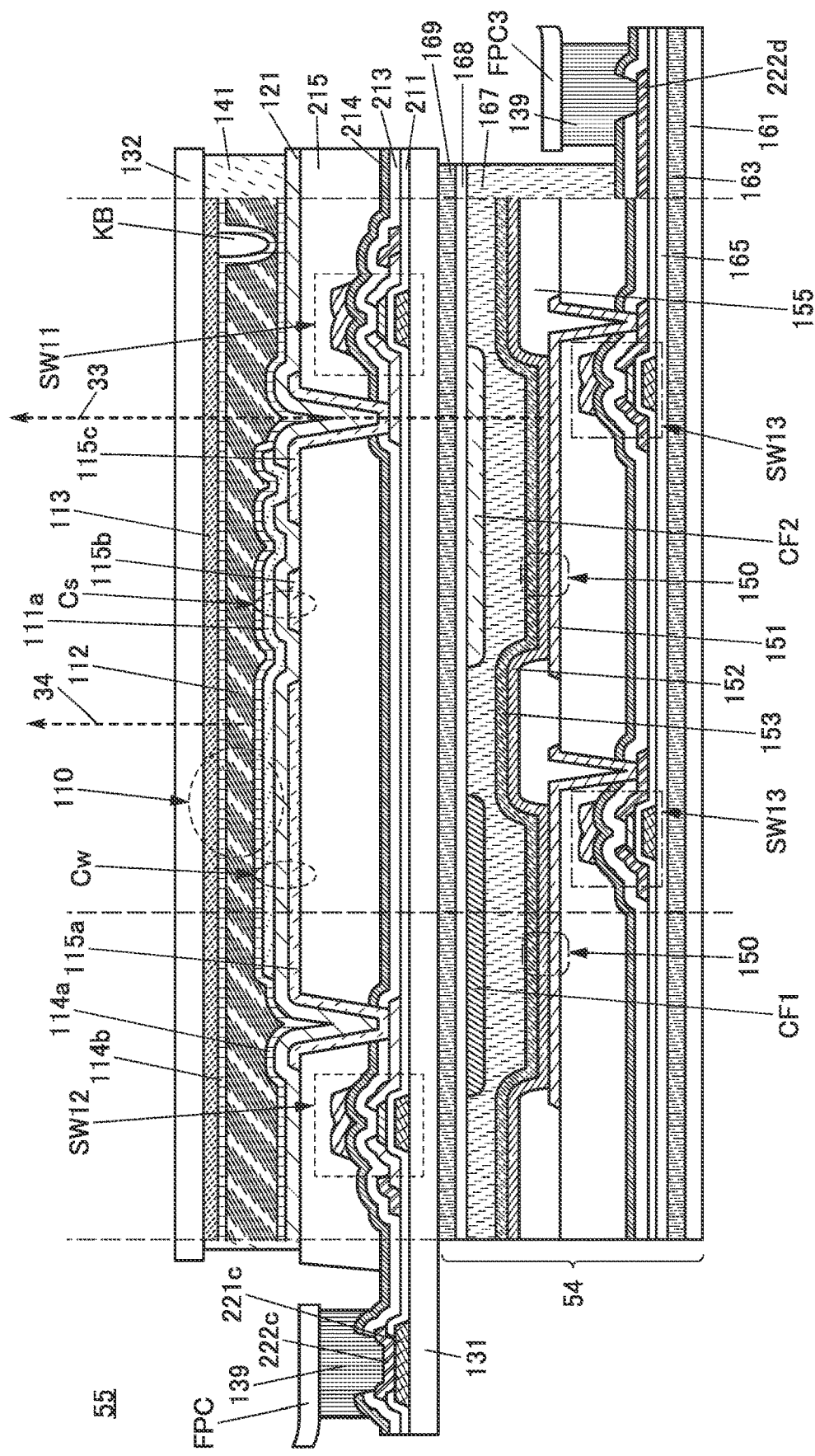
FIG. 10 is a cross-sectional view showing an example of a display module.
Figure 11:
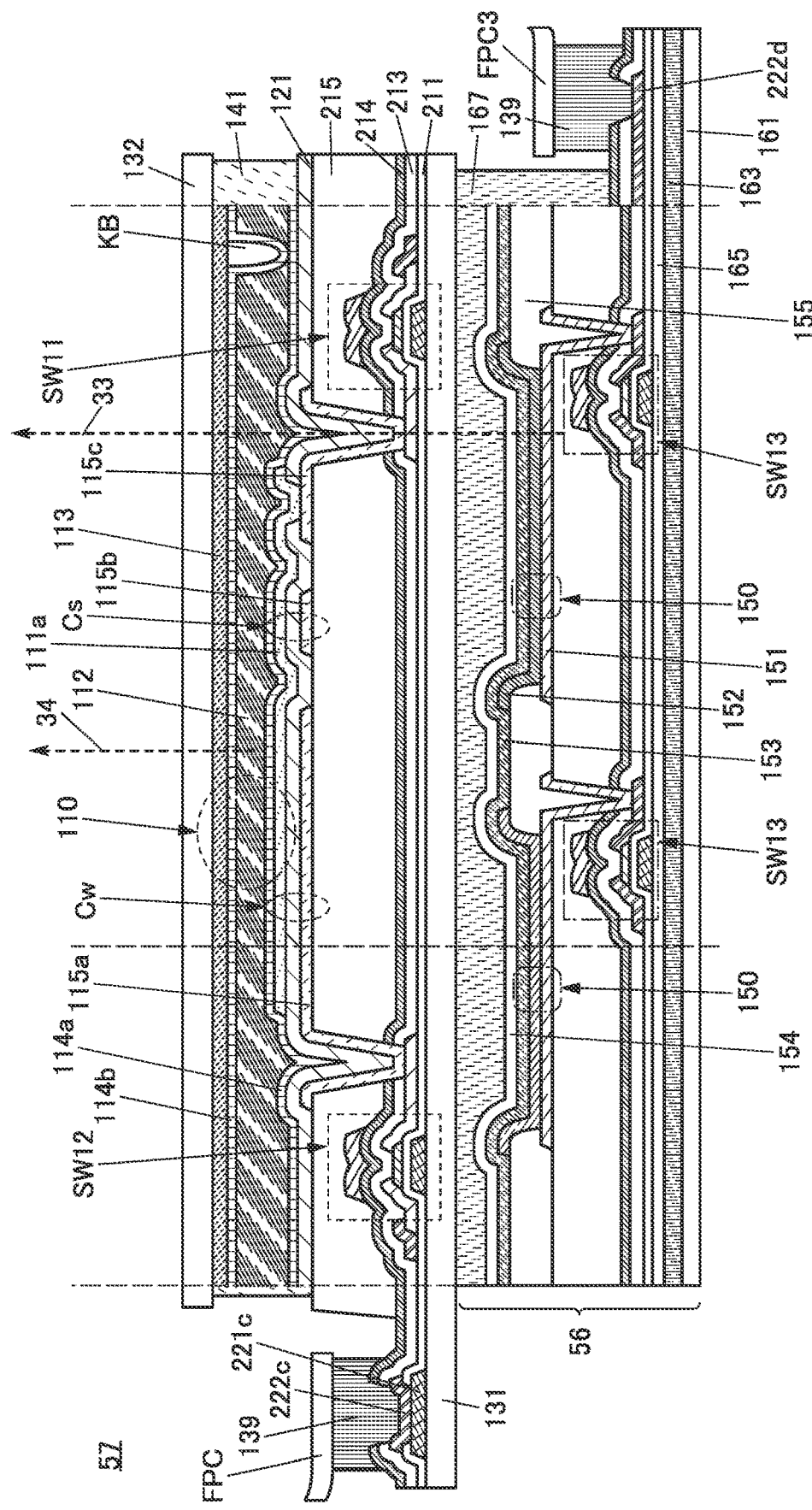
FIG. 11 is a cross-sectional view showing an example of a display module.

A display module 55 illustrated in FIG. 10 and a display module 57 illustrated in FIG. 11 each include a stack including a liquid crystal display device and a light-emitting device. The display modules 55 and 57 each have a structure in which light 33 emitted from the light-emitting device is emitted to the outside through the liquid crystal display device. In addition, the liquid crystal display device has a structure in which light enters from an edge-lit light, a layer containing a liquid crystal material scatters the light, and the scattered light 34 is emitted to the outside.

The structures of the liquid crystal display devices illustrated in FIG. 10 and FIG. 11 are similar to that in FIG. 5A; thus, the detailed description thereof is omitted.

The display module 55 illustrated in FIG. 10 includes a light-emitting device 54. The light-emitting device 54 is bonded to the liquid crystal display device with an adhesive layer 169. The light-emitting device 54 is a top-emission light-emitting device employing a color filter method. A light-emitting element 150 emits light to the liquid crystal display device side through a coloring layer (see the light 33).

The light-emitting device 54 includes a substrate 161, an adhesive layer 163, an insulating layer 165, a transistor SW13, the light-emitting element 150, an adhesive layer 167, an insulating layer 168, a coloring layer CF1, a coloring layer CF2, and the like.

A transistor that can be used for the liquid crystal display device can be used as the transistor SW13. The transistor included in the liquid crystal display device and the transistor included in the light-emitting device 54 may be the same or different from each other.

As the light-emitting element 150, an EL element such as an OLED (Organic Light Emitting Diode) or a QLED (Quantum-dot Light Emitting Diode) is preferably used. As the light-emitting substance contained in the EL element, a substance emitting fluorescence (a fluorescent material), a substance emitting phosphorescence (a phosphorescent material), an inorganic compound (e.g., a quantum dot material), a substance exhibiting thermally activated delayed fluorescence (a thermally activated delayed fluorescent (TADF) material), or the like is given. Alternatively, a light-emitting diode (LED) such as a micro-LED can be used as the light-emitting element 150.

The light-emitting element 150 includes a pixel electrode 151, an EL layer 152, and a common electrode 153. The pixel electrode 151 is electrically connected to a source or a drain of the transistor SW13. The pixel electrode 151 preferably reflects visible light. An end portion of the pixel electrode 151 is covered with an insulating layer 155. The EL layer 152 is shared by a plurality of subpixels. The EL layer 152 contains at least a light-emitting substance. The common electrode 153 transmits visible light.

The light-emitting device 54 includes a plurality of pixels arranged in a matrix. One pixel includes one or more subpixels. One subpixel includes one light-emitting element 150. For example, the pixel can have a structure including three subpixels (e.g., three colors of R, G, and B or three colors of yellow (Y), cyan (C), and magenta (M)) or four subpixels (e.g., four colors of R, G, B, and white (W) or four colors of R, G, B, and Y).

The resolution of the light-emitting device may be the same as or different from the resolution of the liquid crystal display device. In the case where the light-emitting device 54 and the liquid crystal display device have the same resolution, one pixel (a plurality of subpixels) of the light-emitting device 54 overlaps with one pixel of the liquid crystal display device.

Light emitted from the light-emitting element 150 is emitted from the light-emitting device 54 through the coloring layer. For example, light of a first color is extracted through the coloring layer CF1 and light of a second color is extracted through the coloring layer CF2.

An FPC3 is electrically connected to a conductive layer 222d through the connector 139.

Insulating layers having high water resistance are preferably used as the insulating layer 165 and the insulating layer 168. Thus, entry of impurities such as water into the light-emitting element 150 can be inhibited, leading to an increase in the reliability of the light-emitting element 150. The insulating layer 165 and the insulating layer 168 each preferably include an inorganic insulating film.

As the adhesive layers 163, 167, and 169, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

There is no strict limitation on the material and the like of the substrate 161; a variety of substrates can be used. For example, a glass substrate, a quartz substrate, a sapphire substrate, a semiconductor substrate, a ceramic substrate, a metal substrate, a plastic substrate, or the like can be used.

As the substrate 161, a resin substrate of a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, or the like is preferably used, for example. This reduces the thickness and weight of the light-emitting device 54.

The display module 57 illustrated in FIG. 11 includes a light-emitting device 56.

The light-emitting device 56 is different from the light-emitting device 54 mainly in that the coloring layer CF1, the coloring layer CF2, the insulating layer 168, and the adhesive layer 169 are not included, a protective layer 154 is included, and the EL layer 152 is formed for each individual subpixel. Description of components common to those of the light-emitting device 54 will be omitted.

Since the EL layer 152 is formed for each individual subpixel, the light-emitting device 56 does not need a coloring layer. Furthermore, when the protective layer 154 is provided over the common electrode 153, the reliability of the light-emitting element 150 can be increased. The protective layer 154 preferably includes an inorganic film having high water resistance.

As described above, since the display device of one embodiment of the present invention has a function of adding a correction signal to an image signal, a liquid crystal element can be driven at a high voltage. Therefore, a liquid crystal element having a high driving voltage can be used for the display device. For example, even a display device using a liquid crystal element driven with the reverse mode, a liquid crystal element containing a liquid crystal material and a high molecular material, or the like can display an image favorably.

In the display device of one embodiment of the present invention, since the connection portion where the transistor and the pixel electrode are electrically connected to each other has a function of transmitting visible light, the aperture ratio of the pixel can be further increased.

Furthermore, since the display device of one embodiment of the present invention has a function of performing display by the field-sequential driving method, the aperture ratio of the pixel can be further increased, and since a coloring layer such as a color filter can be unnecessary, the transmittance of the pixels can be increased.

The display device of one embodiment of the present invention has a favorable structure for a see-through display.

This embodiment can be combined with the other embodiments as appropriate. In this specification, in the case where a plurality of structure examples are shown in one embodiment, the structure examples can be combined as appropriate.

Embodiment 2

In this embodiment, electronic devices of embodiments of the present invention are described with reference to FIG. 12 to FIG. 14.

An electronic device in this embodiment is provided with the display device of one embodiment of the present invention in a display portion. Therefore, the display portion of the electronic device can display a high-quality image. Moreover, display can be performed with high reliability in a wide temperature range.

The display portion of the electronic device of this embodiment can display an image with a resolution of, for example, full high definition, 2K, 4K, 8K, 16K, or more.

Examples of the electronic devices in which the display device of one embodiment of the present invention can be used include a digital camera, a digital video camera, a digital photo frame, a mobile phone, a portable game console, a portable information terminal, and an audio reproducing device, in addition to electronic devices with a relatively large screen, such as a television device, a desktop or notebook personal computer, a monitor for a computer or the like, digital signage, and a large game machine such as a pachinko machine. Furthermore, the display device of one embodiment of the present invention can be suitably used in portable electronic devices, wearable electronic devices (wearable devices), VR (Virtual Reality) devices, AR (Augmented Reality) devices, and the like.

The electronic device of one embodiment of the present invention may include a secondary battery, and it is preferable that the secondary battery be capable of being charged by contactless power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, a video, data, or the like can be displayed on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Furthermore, an electronic device including a plurality of display portions can have a function of displaying image data mainly on one display portion while displaying text data mainly on another display portion, a function of displaying a three-dimensional image by displaying images on a plurality of display portions with a parallax taken into account, or the like. Furthermore, an electronic device including an image receiving portion can have a function of taking a still image or a moving image, a function of automatically or manually correcting a taken image, a function of storing a taken image in a recording medium (an external recording medium or a recording medium incorporated in the electronic device), a function of displaying a taken image on a display portion, or the like. Note that functions of the electronic device of one embodiment of the present invention are not limited thereto, and the electronic devices can have a variety of functions.

Figure 12A:
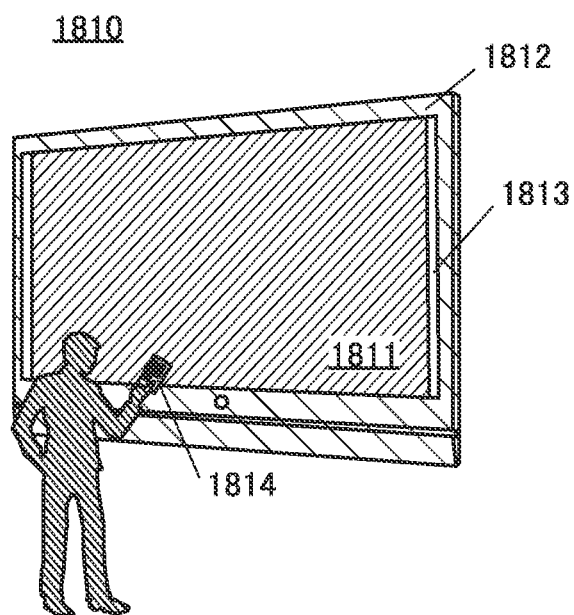
FIG. 12A, FIG. 12B, FIG. 12C, and FIG. 12D are drawings showing examples of electronic devices.

FIG. 12A illustrates a television device 1810. The television device 1810 includes a display portion 1811, a housing 1812, a speaker 1813, and the like. Furthermore, an LED lamp, operation keys (including a power switch or an operation switch), a connection terminal, a variety of sensors, a microphone, and the like can be included.

The television device 1810 can be controlled with a remote controller 1814.

As airwaves the television device 1810 can receive, ground waves, waves transmitted from a satellite, and the like are given. The example of the airwaves also include analog broadcasting, digital broadcasting, image-sound-only broadcasting, and sound-only broadcasting. For example, airwaves transmitted in a certain frequency band in a UHF band (approximately 300 MHz to 3 GHz) or a VHF band (30 MHz to 300 MHz) can be received. When a plurality of pieces of data received in a plurality of frequency bands is used, the transfer rate can be increased and more information can be obtained. Accordingly, the display portion 1811 can display an image with a resolution higher than the full high definition. For example, an image with a resolution of 4K, 8K, 16K, or more can be displayed.

A structure may be employed in which an image to be displayed on the display portion 1811 is generated using broadcasting data transmitted with a technology for transmitting data via a computer network such as the Internet, a LAN (Local Area Network), or Wi-Fi (registered trademark). In that case, the television device 1810 does not necessarily include a tuner.

Figure 12B:
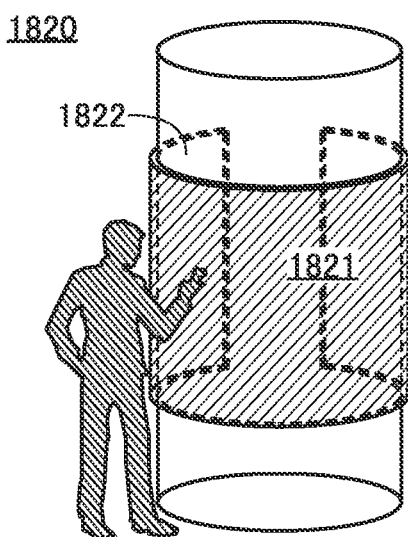

FIG. 12B illustrates a digital signage 1820 mounted on a cylindrical pillar 1822. The digital signage 1820 includes a display portion 1821.

The larger the display portion 1821 is, the more information can be provided at a time. In addition, the larger the display portion 1821 is, the more the display portion 1821 attracts attention, so that the effectiveness of the advertisement can be increased, for example.

It is preferable to use a touch panel in the display portion 1821 because not only a still image or a moving image is displayed on the display portion 1821 but also users can operate intuitively. Moreover, for an application for providing information such as route information or traffic information, usability can be enhanced by intuitive operation.

Figure 12C:
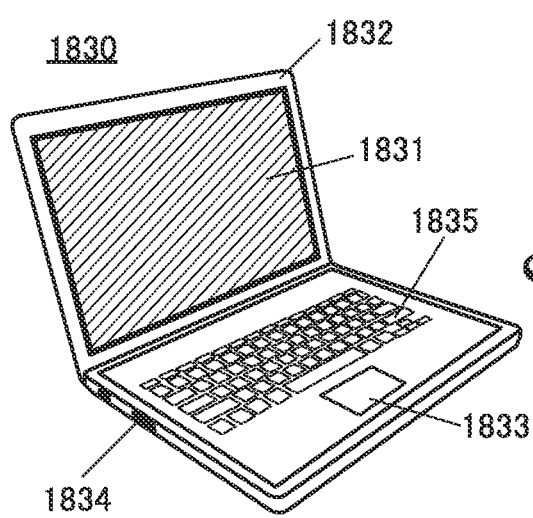

FIG. 12C illustrates a notebook personal computer 1830. The personal computer 1830 includes a display portion 1831, a housing 1832, a touch pad 1833, a connection port 1834, and the like.

The touch pad 1833 functions as an input means such as a pointing device or a pen tablet and can be controlled with a finger, a stylus, or the like.

Furthermore, a display element is incorporated in the touch pad 1833. As illustrated in FIG. 12C, when input keys 1835 are displayed on a surface of the touch pad 1833, the touch pad 1833 can be used as a keyboard. In that case, a vibration module may be incorporated in the touch pad 1833 so that sense of touch is achieved by vibration when the input keys 1835 are touched.

Figure 12D:
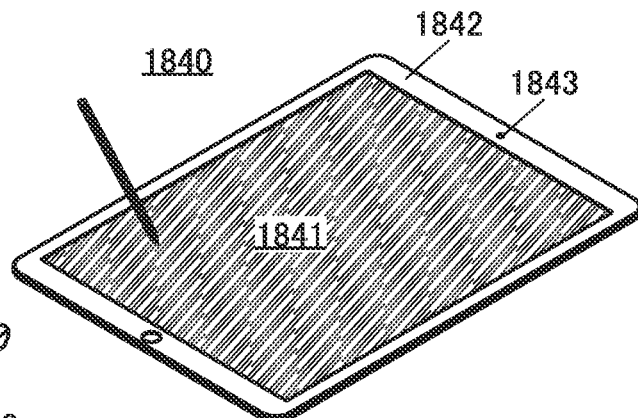

An information terminal 1840 illustrated in FIG. 12D includes a display portion 1841, a housing 1842, a sensing portion 1843, and the like.

When a touch panel is used for the display portion 1841, the information terminal 1840 can be controlled with a finger, a stylus, or the like.

At least one of an illuminance sensor, an imaging device, an attitude detection device, a pressure sensor, a human motion sensor, and the like can be used as the sensing portion 1843.

Figure 13A:
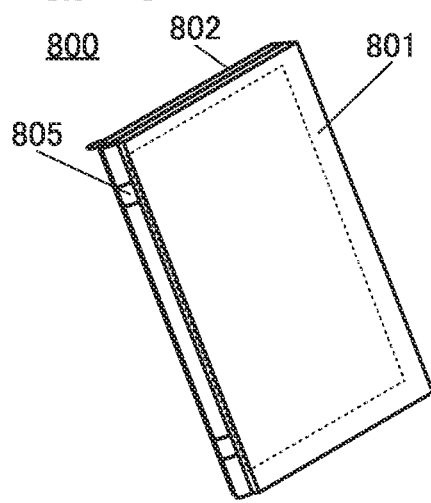
FIG. 13A, FIG. 13B, FIG. 13C, and FIG. 13D are drawings showing examples of electronic devices.
Figure 13B:
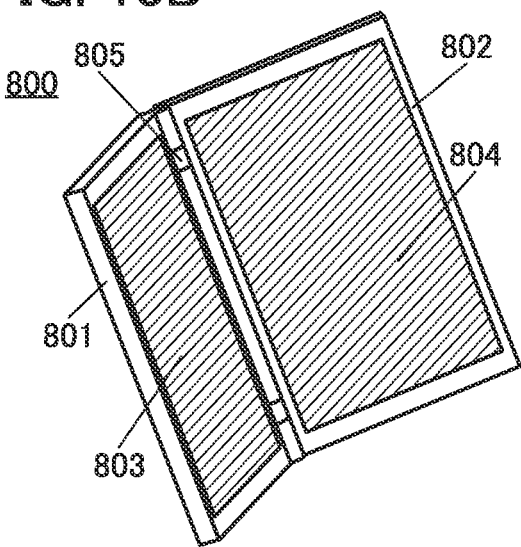

FIG. 13A and FIG. 13B each illustrate a portable information terminal 800. The portable information terminal 800 includes a housing 801, a housing 802, a display portion 803, a display portion 804, a hinge portion 805, and the like.

The housing 801 and the housing 802 are joined together with the hinge portion 805. As for the portable information terminal 800, the housing 801 and the housing 802 can be opened as illustrated in FIG. 13B from a folded state illustrated in FIG. 13A.

For example, text information can be displayed on the display portion 803 and the display portion 804; thus, the portable information terminal can be used as an e-book reader. Furthermore, still images and moving images can be displayed on the display portion 803 and the display portion 804.

The portable information terminal 800 can be folded when being carried, and thus is highly versatile.

Note that the housing 801 and the housing 802 may have a power button, an operation button, an external connection port, a speaker, a microphone, and the like.

Figure 13C:
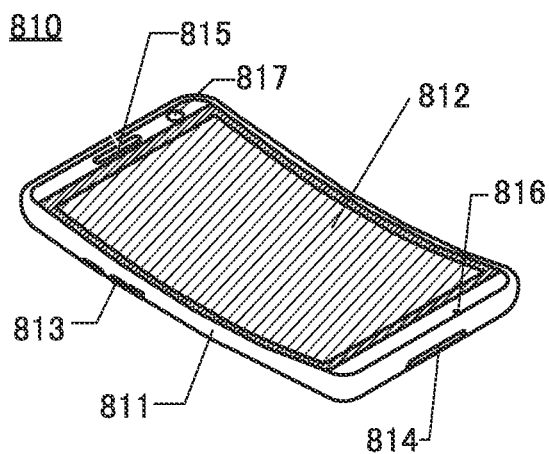

FIG. 13C illustrates an example of a portable information terminal. A portable information terminal 810 illustrated in FIG. 13C includes a housing 811, a display portion 812, an operation button 813, an external connection port 814, a speaker 815, a microphone 816, a camera 817, and the like.

The portable information terminal 810 includes a touch sensor in the display portion 812. All operations including making a call and inputting text can be performed by touch on the display portion 812 with a finger, a stylus, or the like.

By an operation with the operation button 813, power on/off operations and types of images displayed on the display portion 812 can be switched. For example, switching from a mail creation screen to a main menu screen can be performed.

When a detection device such as a gyroscope sensor or an acceleration sensor is provided inside the portable information terminal 810, the direction of display on the screen of the display portion 812 can be automatically changed by determining the orientation (horizontal or vertical) of the portable information terminal 810. Furthermore, the direction of display on the screen can be changed by touch on the display portion 812, operation with the operation button 813, sound input using the microphone 816, or the like.

The portable information terminal 810 has, for example, one or more functions selected from a telephone set, a notebook, an information browsing system, and the like. Specifically, the portable information terminal can be used as a smartphone. The portable information terminal 810 is capable of executing a variety of applications such as mobile phone calls, e-mailing, text viewing and writing, music replay, video replay, Internet communication, and games, for example.

Figure 13D:
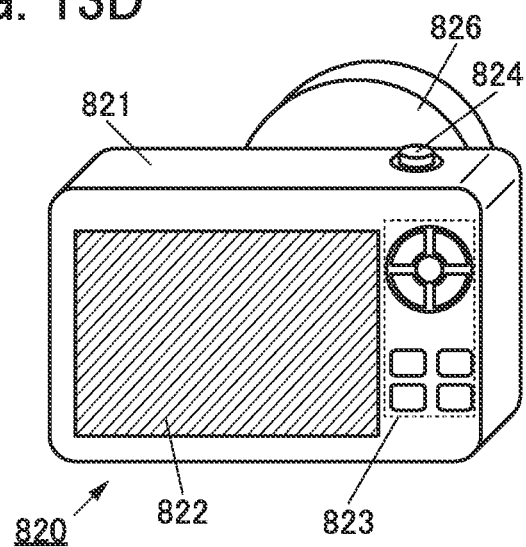

FIG. 13D illustrates an example of a camera. A camera 820 includes a housing 821, a display portion 822, operation buttons 823, a shutter button 824, and the like. Furthermore, a detachable lens 826 is attached to the camera 820.

Although the lens 826 of the camera 820 here is detachable from the housing 821 for replacement, the lens 826 may be integrated with the housing.

A still image or a moving image can be taken with the camera 820 at the press of the shutter button 824. In addition, the display portion 822 has a function of a touch panel, and images can also be taken by the touch on the display portion 822.

Note that a stroboscope, a viewfinder, or the like can be additionally attached to the camera 820. Alternatively, these may be incorporated into the housing 821.

Figure 14A:
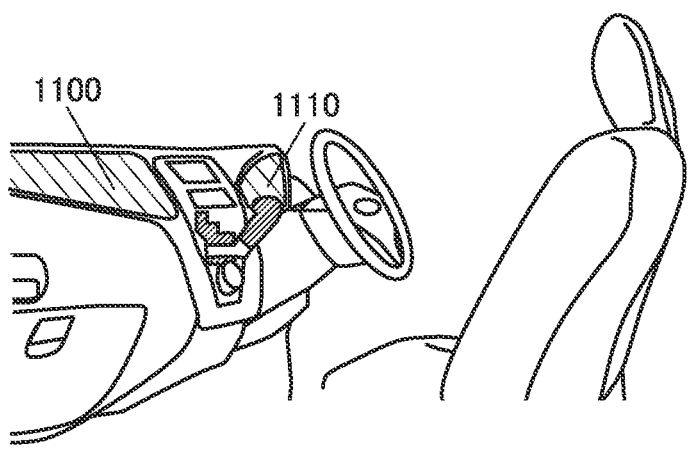
FIG. 14A, FIG. 14B, and FIG. 14C are drawings showing examples of electronic devices.

FIG. 14A illustrates an example in which the display device of one embodiment of the present invention is used as an in-vehicle display. A display portion 1100 and a display portion 1110 can provide various kinds of information by displaying navigation information, a speedometer, a tachometer, a mileage, a fuel meter, a gearshift indicator, air-conditioning settings, and the like. The content or layout of the display can be changed as appropriate in accordance with the preference of a user. The display device of one embodiment of the present invention can be used in a wide temperature range, so that display can be performed with high reliability in both low temperature environment and high temperature environment. Thus, when the display device of one embodiment of the present invention is used as an in-vehicle display, the safety of driving can be increased.

Since the display device of one embodiment of the present invention has a high aperture ratio of a pixel and a small number of light-blocking regions, the view behind the display device can be seen through the display device. Therefore, the display device of one embodiment of the present invention can be used for a windshield of an automobile, a window of a building, a show window, an AR (Augmented Reality) device, and the like.

Figure 14B:
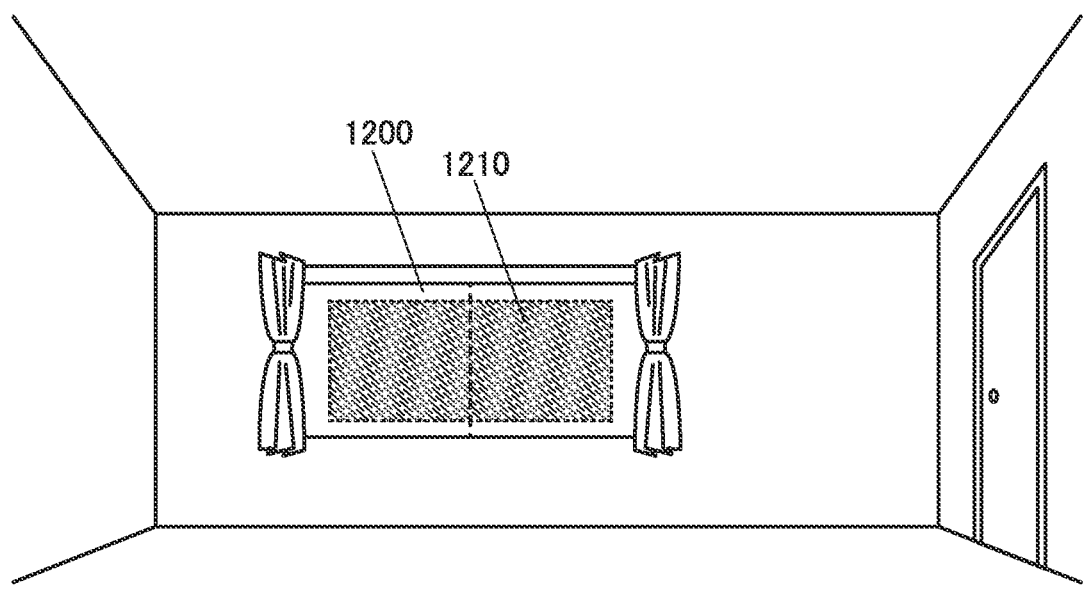

FIG. 14B shows an example in which the display device of one embodiment of the present invention is used for a window of a building. A display device 1200 may be provided for the entire window or the display device 1200 may be provided for part of the window and glass may be used for the other part. The display device 1200 can display an image 1210 toward the inside or outside of a room. When the display device 1200 does not display the image 1210, the display device 1200 transmits light; thus, from one of the inside and the outside of the room, the other of the inside and the outside of the room can be seen through the display device 1200. In other words, the display device 1200 can be used like conventional window glass.

Figure 14C:
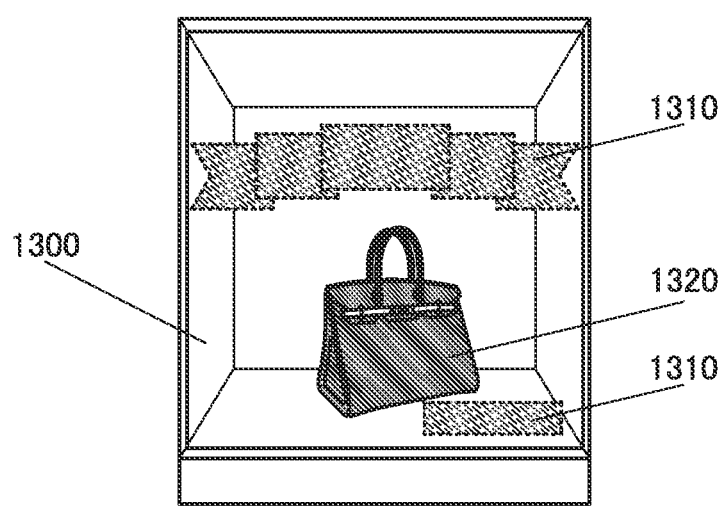

FIG. 14C shows an example in which the display device of one embodiment of the present invention is used for a case having a show window. A display device 1300 may be provided for an entire surface of the case or the display device 1300 may be provided for part of the case and glass may be used for the other part thereof. The display device 1300 can display an image 1310 toward the outside of the case. As the image 1310, for example, an image (a ribbon in FIG. 14C) that decorates an object 1320 to be decorated in the case (a product or the like: a bag in FIG. 14C) is given. The image 1310 may include product description or advertising text.

As described above, electronic devices can be obtained by application of the display device of one embodiment of the present invention. The display device has a remarkably wide application range, and can be used in electronic devices in a variety of fields.

This embodiment can be combined with the other embodiments as appropriate.

REFERENCE NUMERALS

CF1: coloring layer, CF2: coloring layer, CSCOM: wiring, GL1: wiring, GL2: wiring, SL1: wiring, SL2: wiring, SW11: transistor, SW12: transistor, SW13: transistor, VCOM: wiring, 10: display device, 11: touch panel, 15: pixel, 16: pixel, 30: light unit, 32: light, 33: light, 34: scattered light, 35: external light, 50: display module, 51: display module, 52: display module, 54: light-emitting device, 55: display module, 56: light-emitting device, 57: display module, 71: connection portion, 72: connection portion, 100: display region, 110: liquid crystal element, 111a: pixel electrode, 111b: conductive layer, 112: layer containing a liquid crystal material, 113: common electrode, 114a: alignment film, 114b: alignment film, 115a: conductive layer, 115b: conductive layer, 115c: conductive layer, 120: pixel circuit, 121: insulating layer, 131: substrate, 132: substrate, 139: connector, 141: adhesive layer, 150: light-emitting element, 151: pixel electrode, 152: EL layer, 153: common electrode, 154: protective layer, 155: insulating layer, 161: substrate, 163: adhesive layer, 165: insulating layer, 167: adhesive layer, 168: insulating layer, 169: adhesive layer, 180: substrate, 181: electrode, 182: electrode, 185: insulating layer, 186: adhesive layer, 187: wiring, 188: conductive layer, 189: connector, 211: gate insulating layer, 213: insulating layer, 214: insulating layer, 215: insulating layer, 221a: gate, 221b: gate, 221c: conductive layer, 221m: gate, 221n: gate, 221s: gate, 221t: gate, 221u: gate, 222a: conductive layer, 222b: conductive layer, 222c: conductive layer, 222d: conductive layer, 222e: conductive layer, 222f: conductive layer, 222g: conductive layer, 222m: conductive layer, 222n: conductive layer, 222p: conductive layer, 222q: conductive layer, 222s: conductive layer, 222t: conductive layer, 222u: conductive layer, 223a: gate, 223b: gate, 223m: gate, 223n: gate, 223s: gate, 223t: gate, 223u: gate, 225: gate insulating layer, 231a: semiconductor layer, 231b: semiconductor layer, 231i: channel formation region, 231n: low-resistance region, 800: portable information terminal, 801: housing, 802: housing, 803: display portion, 804: display portion, 805: hinge portion, 810: portable information terminal, 811: housing, 812: display portion, 813: operation button, 814: external connection port, 815: speaker, 816: microphone, 817: camera, 820: camera, 821: housing, 822: display portion, 823: operation button, 824: shutter button, 826: lens, 1100: display portion, 1110: display portion, 1200: display device, 1210: image, 1300: display device, 1310: image, 1320: object to be decorated, 1810: television device, 1811: display portion, 1812: housing, 1813: speaker, 1814: remote controller, 1820: digital signage, 1821: display portion, 1822: pillar, 1830: personal computer, 1831: display portion, 1832: housing, 1833: touch pad, 1834: connection port, 1835: input key, 1840: information terminal, 1841: display portion, 1842: housing, 1843: sensing portion

The invention claimed is:

1. A display device comprising a pixel,
wherein the pixel comprises:
a first transistor;
a second transistor;
a first insulating layer;
a first conductive layer over the first insulating layer;
a second insulating layer over the first transistor, the second transistor, the first insulating layer and the first conductive layer;
a pixel electrode over the second insulating layer;
a first capacitor comprising the pixel electrode and the first conductive layer;
a second capacitor comprising the pixel electrode and a second conductive layer;
a first signal line electrically connected to one of a source electrode and a drain electrode of the first transistor;
a second signal line electrically connected to one of a source electrode and a drain electrode of the second transistor;
a layer containing a liquid crystal material over the pixel electrode; and
a common electrode over the layer containing the liquid crystal material,
wherein the first conductive layer is electrically connected to the other of the source electrode and the drain electrode of the first transistor,
wherein the pixel electrode is electrically connected to the other of the source electrode and the drain electrode of the second transistor,
wherein the first insulating layer is positioned over a channel formation region of the first transistor,
wherein the common electrode comprises a region overlapping with the first conductive layer with the layer containing the liquid crystal material and the pixel electrode therebetween,
wherein the pixel further comprises a first connection portion and a second connection portion,
wherein in the first connection portion, the first conductive layer is electrically connected to the first transistor,
wherein in the second connection portion, the pixel electrode is electrically connected to the second transistor, and
wherein the first conductive layer, the pixel electrode, and the common electrode are capable of transmitting visible light.

2. The display device according to claim 1,
wherein the first conductive layer and the second conductive layer are positioned on the same surface,
wherein the first conductive layer and the second conductive layer are electrically insulated from each other, and
wherein the common electrode comprises a region overlapping with the second conductive layer with the layer containing the liquid crystal material and the pixel electrode therebetween.

3. The display device according to claim 1, wherein visible-light transmittance in the layer containing the liquid crystal material is higher in a state where a voltage is not applied between the pixel electrode and the common electrode than in a state where a voltage is applied between the pixel electrode and the common electrode.

4. The display device according to claim 1,
wherein the layer containing the liquid crystal material comprises a high molecular material,
wherein the high molecular material is a copolymer of a polyfunctional monomer and a monofunctional monomer,
wherein the polyfunctional monomer comprises a phenyl benzoate skeleton, and
wherein the monofunctional monomer comprises a cyclohexylbenzene skeleton.

5. The display device according to claim 1, wherein in the first connection portion, the first transistor is capable of transmitting visible light.

6. The display device according to claim 1, wherein in the second connection portion, the second transistor is capable of transmitting visible light.

7. The display device according to claim 1,
wherein the pixel further comprises a third conductive layer,
wherein the first conductive layer and the third conductive layer are positioned on the same surface,
wherein the first conductive layer and the third conductive layer are electrically insulated from each other, and
wherein in the second connection portion, the pixel electrode comprises a region in contact with the third conductive layer and the third conductive layer comprises a region in contact with the other of the source electrode and the drain electrode of the second transistor.

8. The display device according to claim 7, wherein the one of the source electrode and the drain electrode of the second transistor is capable of transmitting visible light.

9. The display device according to claim 1, wherein the first insulating layer is positioned over the first transistor.

10. The display device according to claim 1, wherein the first insulating layer has a planarization function.

11. The display device according to claim 1,
wherein at least one of a gate electrode, the source electrode and the drain electrode of the first transistor, the source electrode and the drain electrode of the second transistor comprises a first layer and a second layer over the first layer, and
wherein the second layer has a lower resistance than the first layer.

12. The display device according to claim 7,
wherein at least one of a gate electrode, the source electrode and the drain electrode of the first transistor, the source electrode and the drain electrode of the second transistor comprises a first layer, a second layer over the first layer, and a third layer over the second layer,
wherein the second layer has a lower resistance than the first layer,
wherein the third layer has a lower visible-light reflectance than the second layer, and
wherein the second layer and the third layer comprise at least one common metal element.

13. The display device according to claim 1, wherein the display device is a field-sequential display.

14. A display module comprising:
the display device according to claim 1; and
at least one of a connector and an integrated circuit.

15. A display module comprising the display device according to claim 1 and a light-emitting device including a stacked light-emitting element,
wherein the light-emitting device is configured to display an image, and
wherein light emitted from the stacked light-emitting element is configured to be extracted through the display device.

16. An electronic device comprising:
the display module according to claim 14; and
at least one of an antenna, a battery, a housing, a camera, a speaker, a microphone and an operation button.

* * * * *